(12) United States Patent
Hibino

(10) Patent No.: US 6,680,872 B2
(45) Date of Patent: Jan. 20, 2004

(54) VIRTUAL GROUND SEMICONDUCTOR MEMORY DEVICE

(75) Inventor: Kenji Hibino, Tokyo (JP)

(73) Assignee: NEC Electronics Corporation, Kawasaki (JP)

( * ) Notice: Subject to any disclaimer, the term of this patent is extended or adjusted under 35 U.S.C. 154(b) by 0 days.

(21) Appl. No.: 10/390,770

(22) Filed: Mar. 19, 2003

(65) Prior Publication Data

US 2003/0185037 A1 Oct. 2, 2003

Related U.S. Application Data

(62) Division of application No. 09/873,343, filed on Jun. 5, 2001.

(30) Foreign Application Priority Data

Jun. 5, 2000 (JP) ........................................ 2000-166964

(51) Int. Cl.$^7$ ................................................ G11C 7/02
(52) U.S. Cl. ............. 365/210; 365/185.16; 365/185.11; 365/230.04; 365/63

(58) Field of Search ..................... 365/210, 185.16, 365/185.11, 230.04, 63

(56) References Cited

U.S. PATENT DOCUMENTS

| | | | |
|---|---|---|---|
| 5,875,128 A | 2/1999 | Ishizuka | |
| 5,966,327 A | 10/1999 | Jo | |
| 6,081,474 A | 6/2000 | Togami et al. | |
| 6,310,811 B1 | 10/2001 | Kohno | |
| 6,462,986 B1 * | 10/2002 | Khan | 365/185.2 |
| 6,473,327 B1 * | 10/2002 | Ishizuka | 365/103 |

* cited by examiner

Primary Examiner—Richard Elms
Assistant Examiner—Toan Le
(74) Attorney, Agent, or Firm—McGinn & Gibb, PLLC

(57) ABSTRACT

A semiconductor memory device includes: a memory cell region having main virtual ground lines; and a reference cell region having reference virtual ground lines, and the reference cell region having substantially the same interconnection routine as said memory cell region, wherein, in said reference cell region, adjacent reference cells to a selected reference cell to be referred are off-bit cells.

14 Claims, 17 Drawing Sheets

ON-bit cell
OFF-bit cell

RD : reference digit line
RVG : reference virtual ground line

BS : bank selecting line
W : word line
GS : ground selecting line

Digit line voltage upon selecting OFF-bit cell

BS : bank selecting line
W : word line
GS : ground selecting line

Memory cell A' adjacent to OFF-bit cells is selected

Virtual ground selector circuit

FIG. 7

| | BS0 | BS1 | GS0 | GS1 | GS2 | GS3 | Y0 | Y1 | Y2 | Y3 | PC0 | PC1 | PC2 | PC3 | VGSf | VGS0 | VGS1 | VGS2 | SPCf | SPC0 | SPC1 | SPC2 |
|---|---|---|---|---|---|---|---|---|---|---|---|---|---|---|---|---|---|---|---|---|---|---|
| BANK00 | H | | H | | | | H | | | | | H | | | | H | | | | | H | |
| BANK01 | | H | H | | | | H | | | | | | H | | H | | | | | | H | |
| BANK02 | | H | | H | | | H | | | | | H | | | | H | | | H | | | |
| BANK03 | H | | | H | | | H | | | | | | H | | | H | | | | | H | |
| BANK04 | H | | | | H | | | H | | | H | | | | | H | | | H | | | |
| BANK05 | | H | | | H | | | H | | | | H | | | | H | | | | H | | |
| BANK06 | | H | | | | H | | H | | | H | | | | | H | | | | | | H |
| BANK07 | H | | | | | H | | H | | | | H | | | | | H | | | H | | |
| BANK10 | H | | H | | | | | | H | | | | | H | | | H | | | | | H |
| BANK11 | | H | H | | | | | | H | | H | | | | | | H | | | H | | |
| BANK12 | | H | | H | | | | | H | | | | | H | | | H | | | | | H |
| BANK13 | H | | | H | | | | | H | | | H | | | | | H | | | H | | |
| BANK14 | H | | | | H | | | | | H | | | H | | | | H | | H | | | |
| BANK15 | | H | | | H | | | | | H | | H | | | | | H | | | | H | |
| BANK16 | | H | | | | H | | | | H | H | | | | | | H | | | | | H |
| BANK17 | H | | H | | | | | | | H | | | H | | | | | H | | | H | |

Dummy virtual ground selector circuit

FIG. 11

| | BS0 | BS1 | GS0 | GS1 | GS2 | GS3 | DY 0 | DY 1 | DY 2 | DY 3 | DP C0 | DP C1 | DP C2 | DP C3 | DV GS0 | DV GS1 | DV GS2 | DSP C0 | DSP C1 | DSP C2 |
|---|---|---|---|---|---|---|---|---|---|---|---|---|---|---|---|---|---|---|---|---|
| BANK00 | H |   | H |   |   |   | H |   |   |   |   | H |   |   | H |   |   |   | H |   |
| BANK01 | H |   |   | H |   |   |   |   | H |   |   | H |   |   |   | H |   | H |   |   |
| BANK02 |   | H |   | H | H |   | H |   |   |   |   | H |   |   | H |   |   |   | H |   |
| BANK03 | H | H |   |   | H |   |   |   | H |   |   | H |   |   |   | H |   | H |   |   |
| BANK04 | H |   |   |   |   |   |   | H |   |   |   |   | H |   | H |   |   |   | H |   |
| BANK05 |   |   |   |   |   | H |   | H |   |   |   |   | H |   |   | H |   | H |   |   |
| BANK06 |   | H |   |   |   | H |   |   |   | H |   |   | H |   | H |   |   |   | H |   |
| BANK07 |   | H | H |   |   |   |   |   |   | H |   |   | H |   |   |   | H |   | H |   |

Memory cell A adjacent to ON-bit cells is selected

Memory cell A' adjacent to OFF-bit cells is selected

VIRTUAL GROUND SEMICONDUCTOR MEMORY DEVICE The present Application is a Divisional Application of U.S. patent application Ser. No. 09/873,343, filed on Jun. 5, 2001.

BACKGROUND OF THE INVENTION

1. Field of the Invention

The present invention relates to a semiconductor memory device, and more particularly to a virtual ground type read only memory device.

2. Description of the Related Art

A virtual-grounded semiconductor memory device has been developed to reduce a chip area. Digit lines are commonly provided for plural memory cells. Sources and drains of adjacent memory cells are common to each other to reduce the number of drain contacts and source contacts, thereby reducing the chip area.

A bias voltage is applied across word and digit lines designated in accordance with an address signal, and a sense amplifier detects a current which flows through a designated memory cell for reading out an information stored in the designated memory cell. Further, a reference signal is supplied to a differential circuit for allowing the differential circuit to judge "0" or "1" for the information detected by the sense amplifier.

In case of a bank-selecting type virtual-grounded semiconductor memory device, configurations of signal lines, ground lines and pre-charge lines are changed upon changing the bank, whereby rising time of the digit lines is also changed. As a result, a time difference from the reference signal is caused.

If a designated bit is adjacent to two ON-bit lines, capacitances of diffusion layers of ON-bit cells are added to a current path, whereby the necessary sense amplifier current or reference current for charging-up the increased capacitance is temporary increased.

The technical term "ON-bit cell" means a cell transistor having a lower threshold voltage than a word line voltage. The technical term "OFF-bit cell" means a cell transistor having a higher threshold voltage than a word line voltage.

FIG. 1A is a circuit diagram of a reference cell region of a conventional virtual-grounded semiconductor memory device. The reference cell region includes two bank selecting lines BS, and transistors Trb0, Trb1, Trb2, and Trb3. Gates of the transistors Trb0, Trb1, Trb2, and Trb3 are connected to the bank selecting lines BS. Sources of the transistors Trb0, Trb1, Trb2, and Trb3 are connected to digit lines. Drains of the transistors Trb0, Trb1, Trb2, and Trb3 are commonly connected to reference digit lines RD0 and RD1.

The reference cell region further includes word lines connected to an X-decoder which is not illustrated, and four ground selecting lines GS connected to gates of transistors Trg0, Trg1, Trg2, Trg3, and Trg4. Drains of the transistors Trg0, Trg1, Trg2, Trg3, and Trg4 are connected to subordinate ground lines for the reference cells. Sources of the transistors Trg0, Trg1, Trg2 and Trg3 are commonly connected to a reference virtual ground line RVG1. A source of the transistor Trg4 is connected to a reference virtual ground line RVG2.

The bank selecting lines BS and the ground selecting lines GS are independent from the X-decoder. In order to select a single bank BANK3, the bank selecting line and the ground selecting line are fixed at high level for placing the transistors Trb1 and Trg2 in ON-state.

The bank BANK3 has the ON-bit cells and the remaining banks have the OFF-bit cells, for which reason the capacitances of the subordinate digit lines and the subordinate virtual ground lines of the remaining banks are not added.

FIG. 1B is a diagram of time-dependent variations in voltage of selected digit lines and reference digit lines when a bank having OFF-bit cells is selected in the reference cell region of FIG. 1A. The reference digit line is charged-up faster than the selected digit line. If the OFF-bit cell of the memory cell region is selected, the reading out operation from the OFF-bit cell is delayed. The delay in reading out operation may be caused depending on the bank. This delay may be so called to as bank dependency.

FIG. 2A is a circuit diagram of another reference cell region of the conventional semiconductor memory device. The other reference cell region of FIG. 2A is structurally different from the above reference cell region of FIG. 1A in the following points. The bank selecting lines BS and the ground selecting lines GS are also connected to the X-decoder which is not illustrated. Further, all of the reference cells are ON-bit cells.

Changing the bank makes the bank-dependency of the flat cells to the memory cells. All of the cells on the same word line are thus ON-bit cells. The capacitances of the subordinate digit lines and the subordinate virtual ground lines are added through the adjacent ON-bit cells to the reference current path.

FIG. 2B is a diagram of time-dependent variations of reference current IRA and sense amplifier current when a memory cell adjacent to OFF-bit cells is selected in the reference cell region of FIG. 2A. If the sense amplifier current is transitionally insufficient, the reference current IRA is transitionally larger than the sense amplifier current ISA'. The judgement to the ON-bit cell by the differential circuit is delayed. The reading out speed or the ON-judgement speed by the sense amplifier is delayed depending on code patterns. This delay may be so called to as code pattern dependency.

In the above circumstances, the development of a novel semiconductor memory device free from the above problems is desirable.

SUMMARY OF THE INVENTION

Accordingly, it is an object of the present invention to provide a novel semiconductor memory device free from the above problems.

It is a further object of the present invention to provide a novel semiconductor memory device free of bank dependency.

It is a still further object of the present invention to provide a novel semiconductor memory device free of code pattern dependency.

It is yet a further object of the present invention to provide a novel semiconductor memory device exhibiting higher speed read-out operation.

The present invention provides a semiconductor memory device including: a memory cell region including main memory cells, main digit lines, and main virtual ground lines, and the memory cell region possessing a first current routine pattern through the main digit line to the main memory cell designated in accordance with a address signal; and a reference cell region including reference memory cells, reference digit lines, and reference virtual ground lines, and the reference cell region possessing a second current routine pattern through the reference digit line to the reference memory cell in accordance with the address signal, wherein the first current routine pattern is always identical with the second current routine pattern upon designating any memory cell addresses.

The above and other objects, features and advantages of the present invention will be apparent from the following descriptions.

BRIEF DESCRIPTION OF THE DRAWINGS

Preferred embodiments according to the present invention will be described in detail with reference to the accompanying drawings.

FIG. 7 is a table of truth values for selecting banks of the memory cell region in the semiconductor memory device of FIG. 3.

FIG. 11 is a table of truth values for selecting banks of the reference cell region in the semiconductor memory device of FIG. 3.

DETAILED DESCRIPTION OF THE PREFERRED EMBODIMENTS

Figure 1A:
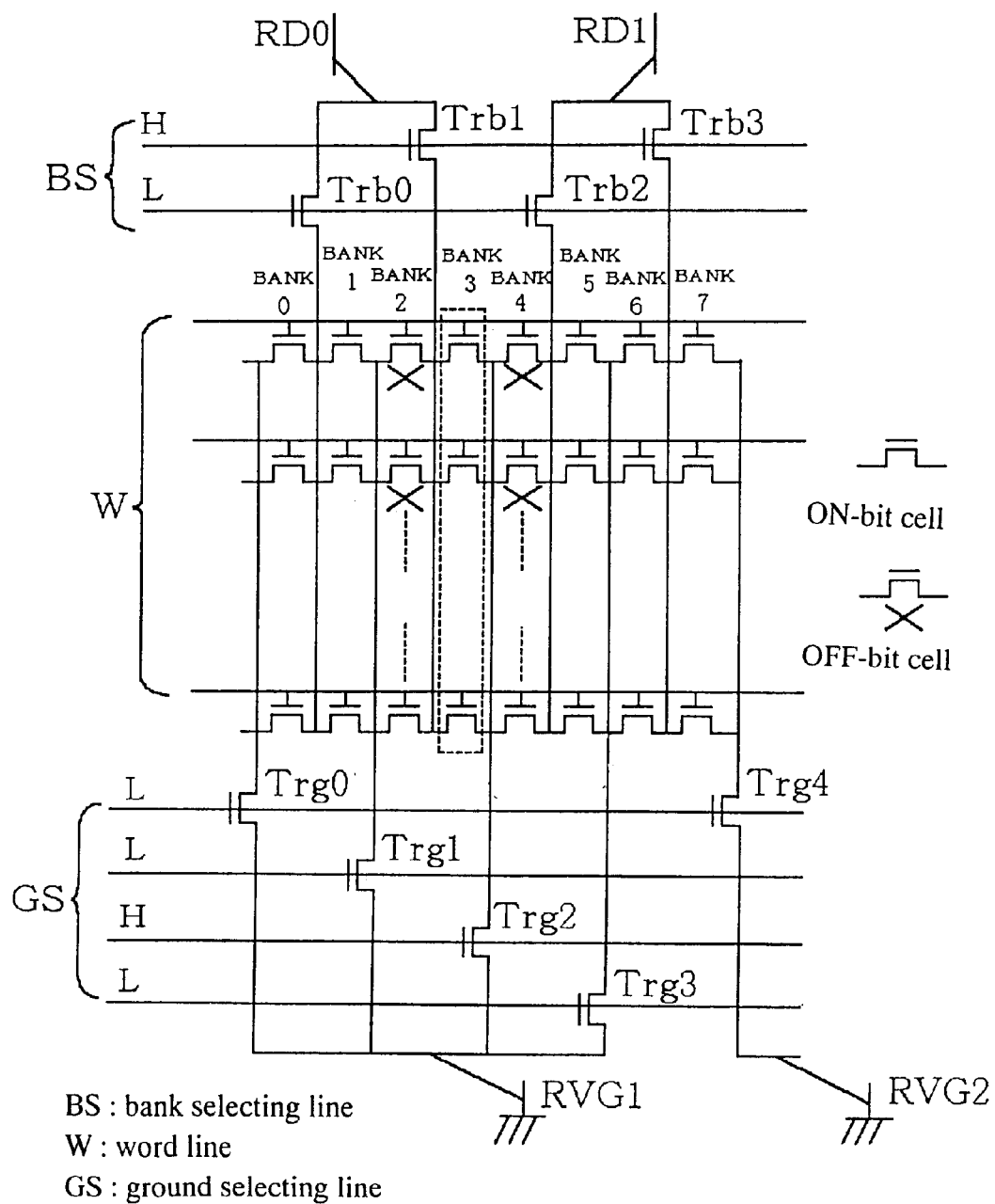
FIG. 1A is a circuit diagram of a reference cell region of a conventional virtual-grounded semiconductor memory device.
Figure 1B:
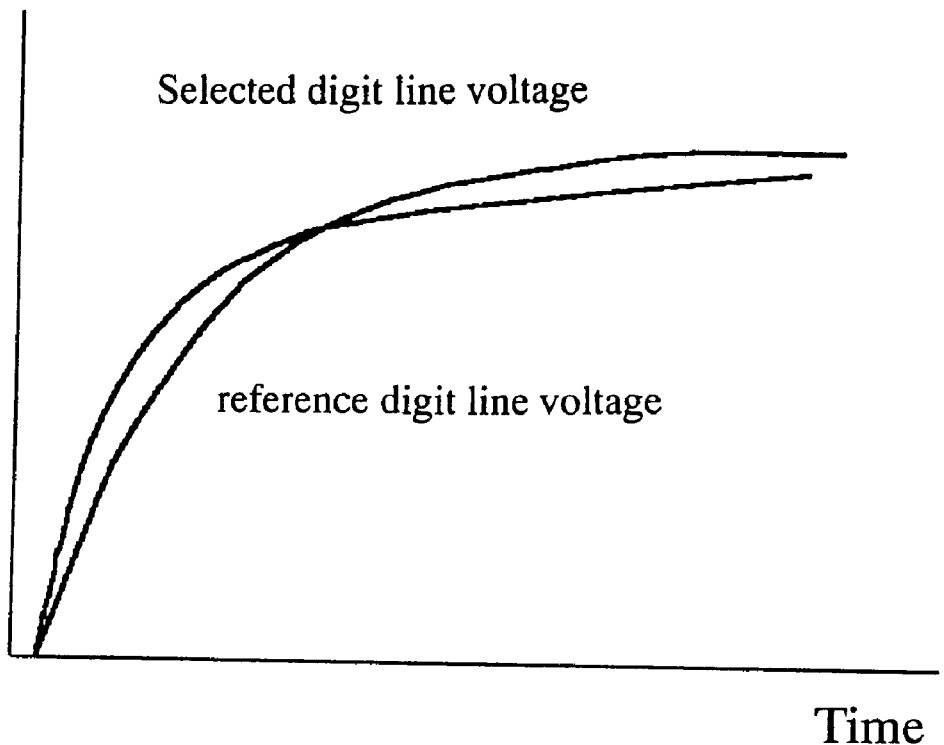
FIG. 1B is a diagram of time-dependent variations in voltage of selected digit lines and reference digit lines when a bank having OFF-bit cells is selected in the reference cell region of FIG. 1A.
Figure 2A:
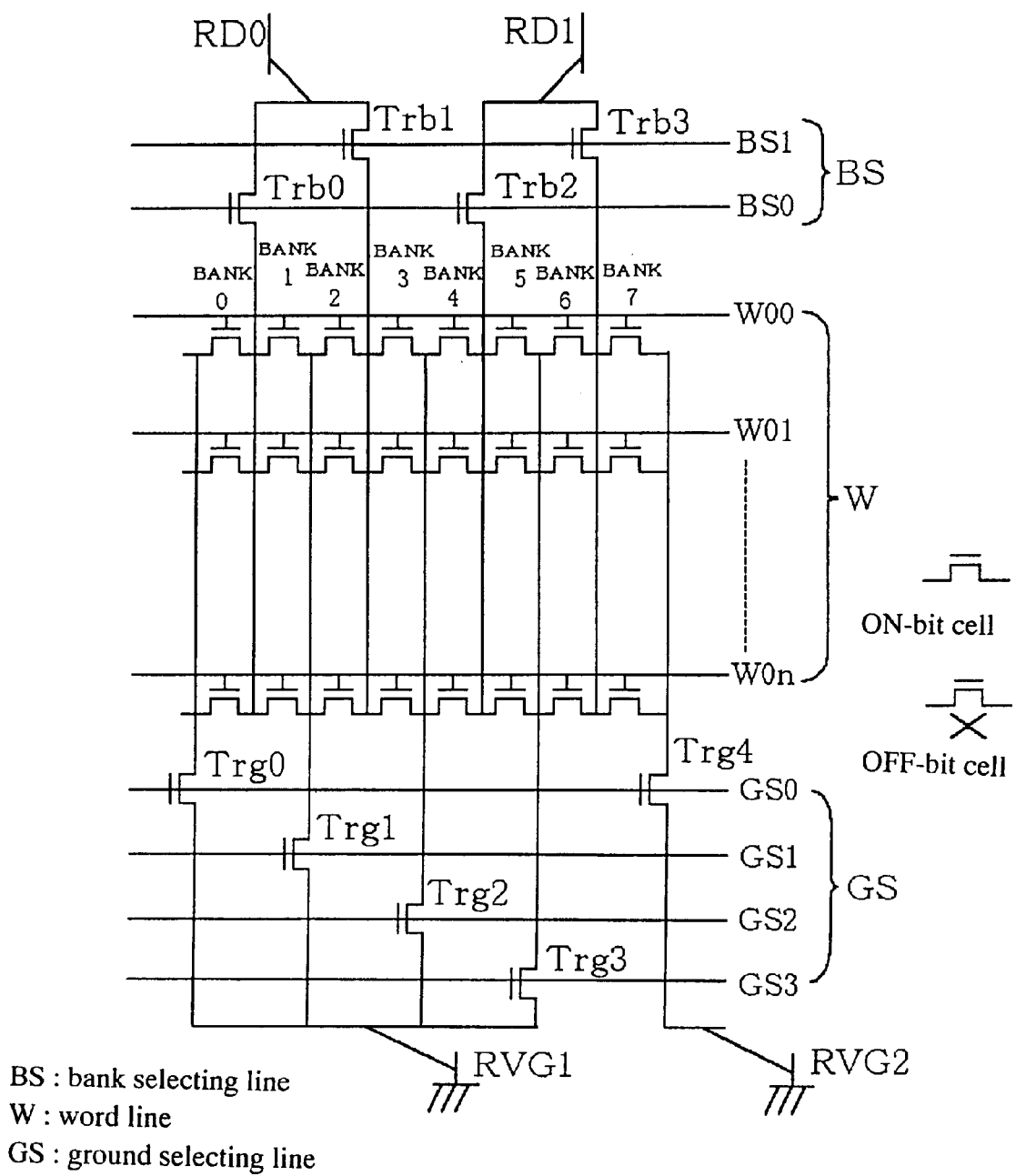
FIG. 2A is a circuit diagram of another reference cell region of the conventional semiconductor memory device.
Figure 2B:
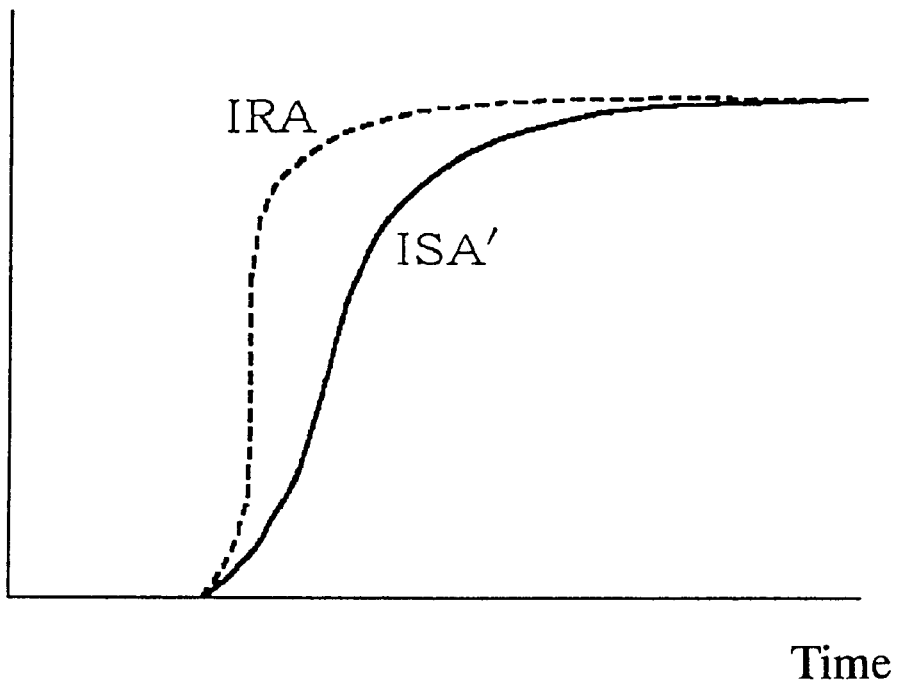
FIG. 2B is a diagram of time-dependent variations of reference current IRA and sense amplifier current when a memory cell adjacent to OFF-bit cells is selected in the reference cell region of FIG. 2A.

A first aspect of the present invention is a semiconductor memory device including: a memory cell region having main virtual ground lines, and the memory cell region exhibiting a first current path pattern on main digit lines, upon designating a memory cell address; and a reference cell region having reference virtual ground lines, and the reference cell region having substantially the same interconnection routine as the memory cell region, the reference cell region exhibiting a second current path pattern on reference digit lines, upon designating the memory cell address, the second current path pattern being identical with the first current path pattern, wherein the current path pattern of the reference cell region is always kept corresponding to the current path pattern of the memory cell region upon designating any memory cell addresses.

It is possible that the semiconductor memory device may further comprise a current detecting circuit, and wherein the memory cell region includes main virtual ground lines and main digit lines, and at least first one of the main digit lines is selectively connected to the current detecting circuit, and at least first one of the main virtual ground lines is selectively connected to a ground line, and the at least first one main digit line connected to the current detecting circuit and the at least first one main virtual ground line connected to the ground line form a first main current route, and wherein the reference cell region further includes reference digit lines, and at least first one of the reference digit lines is selectively connected to the current detecting circuit, and at least first one of the reference virtual ground lines is selectively connected to the ground line, and the at least first one reference digit line connected to the current detecting circuit and the at least first one reference virtual ground line connected to the ground line form a first reference current route, which is identical with the first main current route.

It is possible that the semiconductor memory device may further comprise: a main digit line selector circuit for selecting at least one of the main digit lines, so that the selected at least one main digit line is connected to the current detecting circuit; and a reference digit line selector circuit for selecting at least one of the reference digit lines, so that the selected at least one reference digit line is also connected to the current detecting circuit.

It is possible that the semiconductor memory device may further comprise: a main virtual ground line selector circuit for selecting at least one of the main virtual ground lines, so that the selected at least one main virtual ground line is connected to a ground line; and a reference virtual ground selector circuit for selecting at least one of the reference virtual ground lines, so that the selected at least one reference virtual ground line is also connected to the ground line.

It is possible that the memory cell region further includes subordinate memory digit lines, and the reference cell region further includes subordinate reference digit lines, and the semiconductor memory device may further comprise a bank selecting circuit for selecting at least one of the subordinate memory digit lines, so that the selected at least one subordinate memory digit line is connected to the main digit line, and further selecting at least one of the subordinate reference digit lines, so that the selected at least one subordinate reference digit line is connected to the reference digit line.

It is possible that the semiconductor memory device may further comprise a main pre-charge circuit, and wherein at least second one of the main digit lines is selected and connected to the main pre-charge circuit, and wherein the at least first one main digit line connected to the current detecting circuit, the at least second one of the main digit line connected to the main pre-charge circuit, and the at least first one main virtual ground line connected to the ground line form a second main current route, and wherein at least second one of the reference digit lines is selected and connected to the main pre-charge circuit, and wherein the at least first one reference digit line connected to the current detecting circuit, the at least second one reference digit line connected to the main pre-charge circuit, and the at least first one reference virtual ground line connected to the ground line form a first reference current route, which is identical with the first main current route.

It is possible that the semiconductor memory device may further comprise a subordinate pre-charge circuit, and wherein at least second one of the main virtual ground lines is selected and connected to the subordinate pre-charge circuit, and wherein the at least first one main digit line connected to the current detecting circuit, the at least second one of the main digit line connected to the subordinate pre-charge circuit, the at least first one main virtual ground line connected to the ground line, and the second one main virtual ground line form a third main current route, and wherein at least second one of the reference virtual ground lines is selected and connected to the subordinate pre-charge circuit, and wherein the at least first one reference digit line connected to the current detecting circuit, the at least second one reference digit line connected to the subordinate pre-charge circuit, the at least first one reference virtual ground line connected to the ground line, and the at least second one reference virtual ground line form a fourth reference current route, which is identical with the third main current route.

It is possible that the semiconductor memory device may further comprise: subordinate memory digit lines in the memory cell region subordinate reference digit lines in the reference cell region; and at least a bank selecting circuit for selecting at least one of the subordinate memory digit lines and connecting the selected at least one subordinate memory digit line to the main digit line, as well as for selecting at least one of the subordinate reference digit lines and connecting the selected at least one subordinate reference digit line to the reference digit line.

It is possible that in the reference cell region, adjacent reference cells to a selected reference cell to be referred are off-bit cells.

It is possible that the reference cell region includes adjacent first and second subordinate regions, and the first subordinate region has even number banks having ON-bit cells and odd number banks having OFF-bit cells, and the second subordinate region has even number banks having OFF-bit cells and odd number banks having ON-bit cells.

A second aspect of the present invention is a semiconductor memory device including: a memory cell region including main memory cells, main digit lines, and main virtual ground lines, and the memory cell region possessing a first current routine pattern through the main digit line to the main memory cell designated in accordance with a address signal; and a reference cell region including reference memory cells, reference digit lines, and reference virtual ground lines, and the reference cell region possessing a second current routine pattern through the reference digit line to the reference memory cell in accordance with the address signal, wherein the first current routine pattern is always identical with the second current routine pattern upon designating any memory cell addresses.

This second aspect of the present invention has the same preferable practicable modes described above in connection with the first aspect of the present invention.

A third aspect of the present invention is a semiconductor memory device including: a memory cell region having main digit lines and main virtual ground lines; and a reference cell region having reference digit lines and reference virtual ground lines, and the reference cell region having substantially the same interconnection routine as the memory cell region, a current detecting circuit; a main digit line selector circuit for selecting at least one of the main digit lines, so that the selected at least one main digit line is connected to the current detecting circuit; and a reference digit line selector circuit for selecting at least one of the reference digit lines, so that the selected at least one reference digit line is also connected to the current detecting circuit; a main virtual ground line selector circuit for selecting at least one of the main virtual ground lines, so that the selected at least one main virtual ground line is connected to a ground line; a reference virtual ground selector circuit for selecting at least one of the reference virtual ground lines, so that the selected at least one reference virtual ground line is also connected to the ground line; wherein the at least first one main digit line connected to the current detecting circuit and the at least first one main virtual ground line connected to the ground line form a first main current route, and wherein the at least first one reference digit line connected to the current detecting circuit and the at least first one reference virtual ground line connected to the ground line form a first reference current route, which is identical with the first main current route.

This third aspect of the present invention has the same preferable practicable modes described above in connection with the first aspect of the present invention.

A fourth aspect of the present invention is a semiconductor memory device including: a memory cell region having main digit lines, main virtual ground lines, and subordinate memory digit lines; and a reference cell region having reference digit lines, reference virtual ground lines, and subordinate reference digit lines, and the reference cell region having substantially the same interconnection routine as the memory cell region, wherein adjacent reference cells to a selected reference cell to be referred are off-bit cells, at least a bank selecting circuit for selecting at least one of the subordinate memory digit lines and connecting the selected at least one subordinate memory digit line to the main digit line, as well as for selecting at least one of the subordinate reference digit lines and connecting the selected at least one subordinate reference digit line to the reference digit line; a current detecting circuit; a main digit line selector circuit for selecting at least one of the main digit lines, so that the selected at least one main digit line is connected to the current detecting circuit; a reference digit line selector circuit for selecting at least one of the reference digit lines, so that the selected at least one reference digit line is also connected to the current detecting circuit; a main virtual ground line selector circuit for selecting at least one of the main virtual ground lines, so that the selected at least one main virtual ground line is connected to a ground line; and a reference virtual ground selector circuit for selecting at least one of the reference virtual ground lines, so that the selected at least one reference virtual ground line is also connected to the ground line, wherein the at least first one main digit line connected to the current detecting circuit and the at least first one main virtual ground line connected to the ground line form a first main current route, and wherein the at least first one reference digit line connected to the current detecting circuit and the at least first one reference virtual ground line connected to the ground line form a first reference current route, which is identical with the first main current route.

This fourth aspect of the present invention has the same preferable practicable modes described above in connection with the first aspect of the present invention.

A fifth aspect of the present invention is a semiconductor memory device including: a memory cell region having main virtual ground lines; and a reference cell region having reference virtual ground lines, and the reference cell region having substantially the same interconnection routine as the memory cell region, wherein the reference cell region includes adjacent first and second subordinate regions, and the first subordinate region having even number banks having ON-bit cells and odd number banks having OFF-bit cells, and the second subordinate region having even number banks having OFF-bit cells and odd number banks having ON-bit cells.

This fifth aspect of the present invention has the same preferable practicable modes described above in connection with the first aspect of the present invention.

A sixth aspect of the present invention is a semiconductor memory device comprising: a memory cell region including a plurality of main banks, each having memory cells, main digit lines, main virtual ground lines, subordinate digit lines, and subordinate virtual ground lines; a main digit line selector circuit being connected to the main digit lines for selecting at least one of the main digit lines; a main virtual ground selector circuit being connected to the main virtual ground lines for selecting at least one of the main virtual ground lines; a reference cell region including a plurality of reference banks, each having reference memory cells, reference digit lines, reference virtual ground lines, subordinate reference digit lines and subordinate reference virtual ground lines; a reference digit line selector circuit being connected to the reference digit lines for selecting at least one of the reference digit lines; a reference virtual ground selector circuit being connected to the reference virtual ground lines for selecting at least one of the reference virtual ground lines; a bank selecting circuit connected to the subordinate digit lines and the reference subordinate digit lines for selecting at least one of the subordinate digit lines and connecting the at least one subordinate digit line to the main digit line, and further selecting at least one of the subordinate reference digit lines and connecting the at least one subordinate reference digit line to the reference digit line; and a ground selecting circuit connected to the subordinate main virtual ground lines and the subordinate reference virtual ground lines for selecting at least one of the subordinate main virtual ground lines and connecting the at least one subordinate main virtual ground line to the main virtual ground line, and further selecting at least one of the subordinate reference virtual ground lines and connecting the at least one subordinate reference virtual ground line to the reference virtual ground line, wherein the reference cell region has substantially the same interconnection routine as the memory cell region.

This sixth aspect of the present invention has the same preferable practicable modes described above in connection with the first aspect of the present invention.

A seventh aspect of the present invention is a semiconductor memory device comprising: a memory cell region including a plurality of main banks, each having memory cells, main digit lines, main virtual ground lines, subordinate digit lines, and subordinate virtual ground lines; a main digit line selector circuit being connected to the main digit lines for selecting at least one of the main digit lines; a main virtual ground selector circuit being connected to the main virtual ground lines for selecting at least one of the main virtual ground lines; a reference cell region including a plurality of reference banks, each having reference memory cells, reference digit lines, reference virtual ground lines, subordinate reference digit lines and subordinate reference virtual ground lines; a reference digit line selector circuit being connected to the reference digit lines for selecting at least one of the reference digit lines; a reference virtual ground selector circuit being connected to the reference virtual ground lines for selecting at least one of the reference virtual ground lines; a bank selecting circuit connected to the subordinate digit lines and the reference subordinate digit lines for selecting at least one of the subordinate digit lines and connecting the at least one subordinate digit line to the main digit line, and further selecting at least one of the subordinate reference digit lines and connecting the at least one subordinate reference digit line to the reference digit line; and a ground selecting circuit connected to the subordinate main virtual ground lines and the subordinate reference virtual ground lines for selecting at least one of the subordinate main virtual ground lines and connecting the at least one subordinate main virtual ground line to the main virtual ground line, and further selecting at least one of the subordinate reference virtual ground lines and connecting the at least one subordinate reference virtual ground line to the reference virtual ground line, wherein in the reference cell region, adjacent reference cells to a selected reference cell to be referred are off-bit cells.

This seventh aspect of the present invention has the same preferable practicable modes described above in connection with the first aspect of the present invention.

An eighth aspect of the present invention is a semiconductor memory device comprising: a memory cell region including a plurality of main banks, each having memory cells, main digit lines, main virtual ground lines, subordinate digit lines, and subordinate virtual ground lines; a main digit line selector circuit being connected to the main digit lines for selecting at least one of the main digit lines; a main virtual ground selector circuit being connected to the main virtual ground lines for selecting at least one of the main virtual ground lines; a reference cell region including a plurality of reference banks, each having reference memory cells, reference digit lines, reference virtual ground lines, subordinate reference digit lines and subordinate reference virtual ground lines; a reference digit line selector circuit being connected to the reference digit lines for selecting at least one of the reference digit lines; a reference virtual ground selector circuit being connected to the reference virtual ground lines for selecting at least one of the reference virtual ground lines; a bank selecting circuit connected to the subordinate digit lines and the reference subordinate digit lines for selecting at least one of the subordinate digit lines and connecting the at least one subordinate digit line to the main digit line, and further selecting at least one of the subordinate reference digit lines and connecting the at least one subordinate reference digit line to the reference digit line; and a ground selecting circuit connected to the subordinate main virtual ground lines and the subordinate reference virtual ground lines for selecting at least one of the subordinate main virtual ground lines and connecting the at least one subordinate main virtual ground line to the main virtual ground line, and further selecting at least one of the subordinate reference virtual ground lines and connecting the at least one subordinate reference virtual ground line to the reference virtual ground line, wherein the memory cell region possesses a first current routine pattern through the main digit line to the main memory cell designated in accordance with a address signal, and the reference cell region possesses a second current routine pattern through the reference digit line to the reference memory cell in accordance with the address signal, and wherein the first current routine pattern is always identical with the second current routine pattern upon designating any memory cell addresses.

This eighth aspect of the present invention has the same preferable practicable modes described above in connection with the first aspect of the present invention.

A ninth aspect of the present invention is a semiconductor memory device comprising: a memory cell region including a plurality of main banks, each having memory cells, main digit lines, main virtual ground lines, subordinate digit lines, and subordinate virtual ground lines; a main digit line selector circuit being connected to the main digit lines for selecting at least one of the main digit lines; a main virtual ground selector circuit being connected to the main virtual ground lines for selecting at least one of the main virtual ground lines; a reference cell region including a plurality of reference banks, each having reference memory cells, reference digit lines, reference virtual ground lines, subordinate reference digit lines and subordinate reference virtual ground lines; a reference digit line selector circuit being connected to the reference digit lines for selecting at least one of the reference digit lines; a reference virtual ground selector circuit being connected to the reference virtual ground lines for selecting at least one of the reference virtual ground lines; a bank selecting circuit connected to the subordinate digit lines and the reference subordinate digit lines for selecting at least one of the subordinate digit lines and connecting the at least one subordinate digit line to the main digit line, and further selecting at least one of the subordinate reference digit lines and connecting the at least one subordinate reference digit line to the reference digit line; and a ground selecting circuit connected to the subordinate main virtual ground lines and the subordinate reference virtual ground lines for selecting at least one of the subordinate main virtual ground lines and connecting the at least one subordinate main virtual ground line to the main virtual ground line, and further selecting at least one of the subordinate reference virtual ground lines and connecting the at least one subordinate reference virtual ground line to the reference virtual ground line, wherein the reference cell region includes adjacent first and second subordinate regions, and the first subordinate region having even number banks having ON-bit cells and odd number banks having OFF-bit cells, and the second subordinate region having even number banks having OFF-bit cells and odd number banks having ON-bit cells.

This ninth aspect of the present invention has the same preferable practicable modes described above in connection with the first aspect of the present invention.

Figure 3:
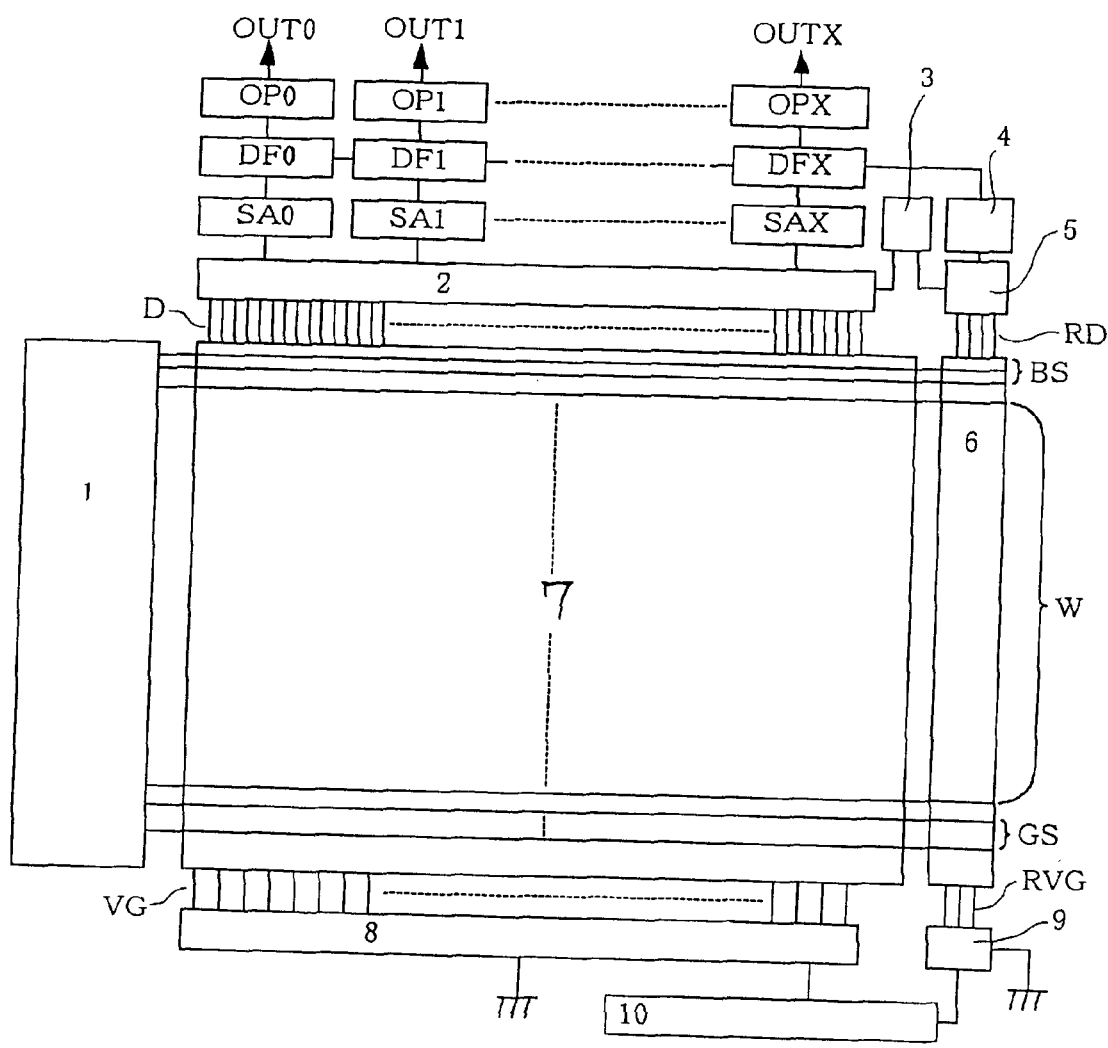
FIG. 3 is a block diagram of a semiconductor memory device in a first embodiment in accordance with the present invention.

A preferred embodiment according to the present invention will be described in detail with reference to the drawings. FIG. 3 is illustrative of a semiconductor memory device of this first embodiment according to the present invention.

The semiconductor memory device includes a memory cell region 7 which includes memory cell arrays. The memory cell region 7 further includes main digit lines D, main virtual ground lines VG, bank selecting lines BS, word lines W, and ground selecting lines GS for selecting, in a bank unit, cell transistors in the memory cell arrays.

The semiconductor memory device may include an X-decoder 1 being connected to the bank selecting lines BS, the word lines W, and the ground selecting lines GS of the memory cell region 7. The X-decoder 1 receives address signals for decoding the same, so that in accordance with the decoded signals, the X-decoder 1 selects one of the bank selecting lines BS, one of the word lines W, and one of the ground selecting lines GS.

The semiconductor memory device may include a Y-selector circuit 2 being connected to the main digit lines D of the memory cell region 7. The semiconductor memory device may also include sense amplifiers SA0, - - - SAX, which are connected to the Y-selector circuit 2. The semiconductor memory device may also include differential circuits DF0, - - - DFX, which are connected to the sense amplifiers SA0, - - - SAX, respectively. The semiconductor memory device may also include output stages OP0, - - - OPX, which are connected to the differential circuits DF0, - - - DFX, respectively. The output stages OP0, - - - OPX are also connected to output terminals OUT0, - - - OUTX.

The semiconductor memory device may also include a single pre-charge circuit 3 which is connected to the Y-selector circuit 2. The pre-charge circuit 3 supplies a bias voltage to non-selected memory cells of the memory cell region 7 based on the selected memory cell.

The Y-selector circuit 2 receives another address signal for selecting plural pairs of the main digit lines D and connecting the selected pairs of the main digit lines D to the sense amplifiers SA0, - - - SAX, and the pre-charge circuit 3.

The semiconductor memory device may also include a virtual ground line selector circuit 8 being connected to main virtual ground lines VG of the memory cell region 7. The virtual ground line selector circuit 8 being connected to a ground line GND. The semiconductor memory device may also include a subordinate pre-charge circuit 10 which is connected to the virtual ground line selector circuit 8. The subordinate pre-charge circuit 10 also supplies another bias voltage to non-selected memory cells of the memory cell region 7 based on the selected memory cell.

The virtual ground line selector circuit 8 receives still another address signal for selecting one of the main virtual ground lines VG and connecting the selected one of the main virtual ground lines VG to the ground line GND and the subordinate pre-charge circuit 10.

The semiconductor memory device also includes a reference cell region 6 which includes reference cell arrays. The reference cell region 6 includes reference digit lines RD. The reference cell region 6 generates a digit line reference signal to be used for read-out signal for reading out storage informations from the memory cell region 7.

The semiconductor memory device may also include a dummy Y-selector circuit 5 being connected to the reference digit lines RD of the reference cell region 6. The dummy Y-selector circuit 5 is also connected to the pre-charge circuit 3. The semiconductor memory device may also include a reference amplifier 4 connected to the dummy Y-selector circuit 5 and the differential circuits DF0, - - - DFX. The dummy Y-selector circuit 5 receives yet another address signal for selecting one pair of the reference digit lines RD and connecting the selected one pair of the reference digit lines RD to the reference amplifier 4 and the pre-charge circuit 3.

The semiconductor memory device may also include a dummy virtual ground line selector circuit 9 being connected to the reference virtual ground lines RVD of the reference cell region 6. The dummy virtual ground line selector circuit 9 is also connected to the subordinate pre-charge circuit 10 and the ground line GND. The dummy virtual ground line selector circuit 9 receives further another address signal for selecting one of the reference virtual ground lines RVD of the reference cell region 6 and connecting the selected one reference virtual ground line RVD to the subordinate pre-charge circuit 10 and the ground line GND.

Each of the sense amplifiers SA0, - - - SAX supplies a voltage to the memory cell transistor of the memory cell region 7 through a Y-selector transistor and a bank selector transistor. The reference amplifier 4 may have the same interconnection routine as the sense amplifiers SA0, - - - SAX. The reference amplifier 4 supplies a voltage to cell transistor of the reference cell region 6 through a dummy Y-cell selector transistor and a bank selector transistor.

The differential circuits DF0, - - - DFX receive sense amplifier currents ISA which are supplied to the memory cell transistors of the memory cell region 7 from the sense amplifiers SA0, - - - SAX. The differential circuits DF0, - - - DFX also receive a reference current IRA which is supplied to the memory cell transistor of the reference cell region 6 from the reference amplifier 4. The differential circuits DF0, - - - DFX compare the sense amplifier currents ISA to the reference current IRA for judging whether the selected cell is ON-bit cell or OFF-bit cell. The differential circuits DF0, - - - DFX output binary digit data of "0" or "1" which indicate ON-bit cell or OFF-bit cell. Each of the differential circuits DF0, - - - DFX may generally have a ratio as follows.

ON-bit cell "0": ISA is larger than (IRA)/2
OFF-bit cell "1": ISA is smaller than (IRA)/2

The output stages OP0, - - - OPX receive ON-bit/OFF-bit output signals from the differential circuits DF0, - - - DFX and amplify the signals for outputting output signals OUT0, - - - OUTX.

The X-decoder 1, the sense amplifiers SA0, - - - SAX, the reference amplifier 4, the differential circuits DF0, - - - DFX, the output stages OP0, - - - OPX, the pre-charge circuit 3, and the subordinate pre-charge circuit 10 may be configured by the known circuit configurations.

Figure 4:
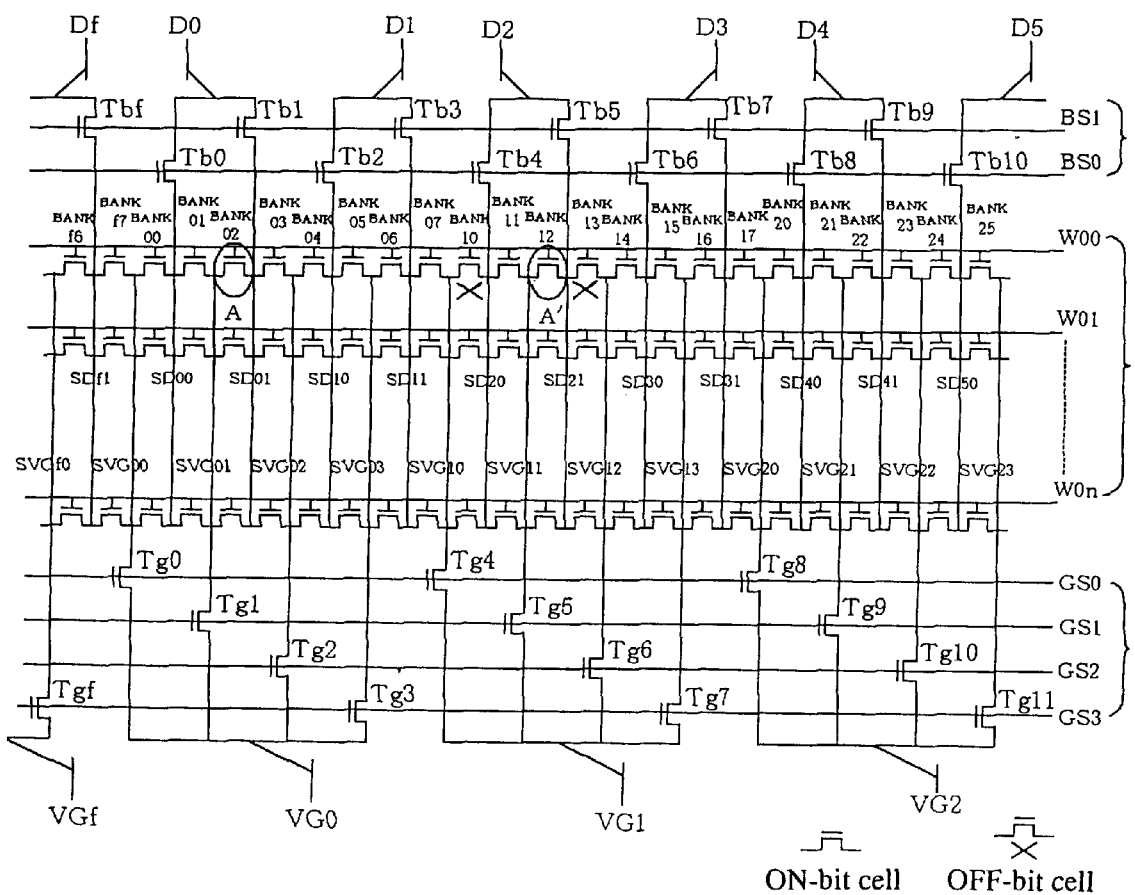
FIG. 4 is a fragmentary circuit diagram of the memory cell region having a flat-cell structure in the semiconductor device of FIG. 3.

FIG. 4 is a fragmentary circuit diagram of the memory cell region having a flat-cell structure in the semiconductor device of FIG. 3. the memory cell region 7 includes main digit lines Df, D0, D1, D2, D3, D4 and D5 which may comprise metal interconnections, and main virtual ground lines VGf, VG0, VG1, VG2, VG3, VG4 and VG5 which may comprise metal interconnections. The memory cell region 7 also includes subordinate digit lines SDf1, SD00, SD01, SD10, SD11, SD20, SD21, SD30, SD31, SD40, SD41, and SD50 which may comprise diffusion layers. The memory cell region 7 also includes subordinate virtual ground lines SVGf0, SVG00, SVG01, SVG02, SVG03, SVG10, SVG11, SVG12, SVG13, SVG20, SVG21, SVG22, and SVG23.

The memory cell region 7 also includes word lines W00, W01, - - - W0n. The memory cell region 7 also includes bank selecting lines BS0 and BS1. The memory cell region 7 also includes ground selecting lines GS0, GS1, GS2 and GS3.

The memory cell region 7 also includes bank selector transistors Tbf, Tb0, Tb1, Tb2, Tb3, Tb4, Tb5, Tb6, Tb7, Tb8, Tb9, and Tb10. The bank selecting transistor Tbf is connected in series between the main digit line Df and the subordinate digit line SDf1. The bank selecting transistor Tb0 is connected in series between the main digit line D0 and the subordinate digit line SD00. The bank selecting transistor Tb1 is connected in series between the main digit line D0 and the subordinate digit line SD01.

The bank selecting transistor Tb2 is connected in series between the main digit line D1 and the subordinate digit line SD10. The bank selecting transistor Tb3 is connected in series between the main digit line D1 and the subordinate digit line SD11. The bank selecting transistor Tb4 is connected in series between the main digit line D2 and the subordinate digit line SD20. The bank selecting transistor Tb5 is connected in series between the main digit line D2 and the subordinate digit line SD21. The bank selecting transistor Tb6 is connected in series between the main digit line D3 and the subordinate digit line SD30. The bank selecting transistor Tb7 is connected in series between the main digit line D3 and the subordinate digit line SD31. The bank selecting transistor Tb8 is connected in series between the main digit line D4 and the subordinate digit line SD40. The bank selecting transistor Tb9 is connected in series between the main digit line D4 and the subordinate digit line SD41. The bank selecting transistor Tb10 is connected in series between the main digit line D5 and the subordinate digit line SD50.

The bank selecting line BS1 is connected to gates of the bank selector transistors Tbf, Tb1, Tb3, Tb5, Tb7 and Tb9. The bank selecting line BS0 is connected to gates of the bank selector transistors Tb0, Tb2, Tb4, Tb6, Tb8 and Tb10.

The memory cell region 7 also includes ground selector transistors Tgf, Tg0, Tg1, Tg2, Tg3, Tg4, Tg5, Tg6, Tg7, Tg8, Tg9, Tg10 and Tg11. The ground selecting transistor Tgf is connected in series between the main virtual ground line VGf and the subordinate virtual ground line SVGf1. The ground selecting transistor Tg0 is connected in series between the main virtual ground line VG0 and the subordinate virtual ground line SVG00. The ground selecting transistor Tg1 is connected in series between the main virtual ground line VG0 and the subordinate virtual ground line SVG01. The ground selecting transistor Tg2 is connected in series between the main virtual ground line VG0 and the subordinate virtual ground line SVG02. The ground selecting transistor Tg3 is connected in series between the main virtual ground line VG0 and the subordinate virtual ground line SVG03. The ground selecting transistor Tg4 is connected in series between the main virtual ground line VG1 and the subordinate virtual ground line SVG10. The ground selecting transistor Tg5 is connected in series between the main virtual ground line VG1 and the subordinate virtual ground line SVG11. The ground selecting transistor Tg6 is connected in series between the main virtual ground line VG1 and the subordinate virtual ground line SVG12. The ground selecting transistor Tg7 is connected in series between the main virtual ground line VG1 and the subordinate virtual ground line SVG13. The ground selecting transistor Tg8 is connected in series between the main virtual ground line VG2 and the subordinate virtual ground line SVG20. The ground selecting transistor Tg9 is connected in series between the main virtual ground line VG2 and the subordinate virtual ground line SVG21. The ground selecting transistor Tg10 is connected in series between the main virtual ground line VG2 and the subordinate virtual ground line SVG22. The ground selecting transistor Tg11 is connected in series between the main virtual ground line VG2 and the subordinate virtual ground line SVG23.

The ground selecting line GS0 is connected to gates of the ground selecting transistors Tg0, Tg4, and Tg8. The ground selecting line GS1 is connected to gates of the ground selecting transistors Tg1, Tg5, and Tg9. The ground selecting line GS2 is connected to gates of the ground selecting transistors Tg2, Tg6, and Tg10. The ground selecting line GS3 is connected to gates of the ground selecting transistors Tgf, Tg3, Tg7, and Tg11.

The bank selecting lines BS0 and BS1 are connected to the gates of the bank selector transistors Tbf, Tb0, Tb1, Tb2, Tb3, Tb4, Tb5, Tb6, Tb7, Tb8, Tb9, and Tb10 for selectively connecting the subordinate digit lines SDf1, SD00, SD01, SD10, SD11, SD20, SD21, SD30, SD31, SD40, SD41, and SD50 to the main digit lines Df, F0, D1, D2, D3, D4, and D5. The ground selecting lines GS0, GS1, GS2 and GS3 are connected to the gates of the ground selector transistors Tgf, Tg0, Tg1, Tg2, Tg3, Tg4, Tg5, Tg6, Tg7, Tg8, Tg9, Tg10 and Tg11 for selectively connecting the subordinate virtual ground lines SVGf0, SVG00, SVG01, SVG02, SVG03, SVG10, SVG11, SVG12, SVG13, SVG20, SVG21, SVG22, and SVG23 to the main virtual ground lines VGf, VG0, VG1, and VG2.

The memory cell region 7 also includes memory cell transistors which are connected in series between adjacent pairs of the subordinate digit lines SDf1, SD00, SD01, SD10, SD11, SD20, SD21, SD30, SD31, SD40, SD41, and SD50 and the subordinate virtual ground lines SVGf0, SVG00, SVG01, SVG02, SVG03, SVG10, SVG11, SVG12, SVG13, SVG20, SVG21, SVG22, and SVG23.

A bank BANKf6 has memory cell transistors which are connected in series between the subordinate virtual ground line SVGf0, and the subordinate digit line SDf1, wherein gates of the memory cell transistors are respectively connected to the word lines W00, - - - W0n.

A bank BANKf7 has memory cell transistors which are connected in series between the subordinate virtual ground line SVG00, and the subordinate digit line SDf1, wherein gates of the memory cell transistors are respectively connected to the word lines W00, - - - W0n.

A bank BANK00 has memory cell transistors which are connected in series between the subordinate virtual ground line SVG00, and the subordinate digit line SD00, wherein gates of the memory cell transistors are respectively connected to the word lines W00, - - - W0n.

A bank BANK01 has memory cell transistors which are connected in series between the subordinate virtual ground line SVG01, and the subordinate digit line SD00, wherein gates of the memory cell transistors are respectively connected to the word lines W00, - - - W0n.

A bank BANK02 has memory cell transistors which are connected in series between the subordinate virtual ground line SVG01, and the subordinate digit line SD01, wherein gates of the memory cell transistors are respectively connected to the word lines W00, - - - W0n.

A bank BANK03 has memory cell transistors which are connected in series between the subordinate virtual ground line SVG02, and the subordinate digit line SD01, wherein gates of the memory cell transistors are respectively connected to the word lines W00, - - - W0n.

A bank BANK04 has memory cell transistors which are connected in series between the subordinate virtual ground line SVG02, and the subordinate digit line SD10, wherein gates of the memory cell transistors are respectively connected to the word lines W00, - - - W0n.

A bank BANK05 has memory cell transistors which are connected in series between the subordinate virtual ground line SVG03, and the subordinate digit line SD10, wherein gates of the memory cell transistors are respectively connected to the word lines W00, - - - W0n.

A bank BANK06 has memory cell transistors which are connected in series between the subordinate virtual ground line SVG03, and the subordinate digit line SD11, wherein gates of the memory cell transistors are respectively connected to the word lines W00, - - - W0n.

A bank BANK07 has memory cell transistors which are connected in series between the subordinate virtual ground line SVG10, and the subordinate digit line SD11, wherein gates of the memory cell transistors are respectively connected to the word lines W00, - - - W0n.

The above eight banks BANK00, BANK01, BANK02, BANK03, BANK04, BANK05, BANK06, and BANK07 form a first unit. The number of the banks for a single unit may optionally be decided in consideration of memory capacity.

A bank BANK10 has memory cell transistors which are connected in series between the subordinate virtual ground line SVG10, and the subordinate digit line SD20, wherein gates of the memory cell transistors are respectively connected to the word lines W00, - - - W0n.

A bank BANK11 has memory cell transistors which are connected in series between the subordinate virtual ground line SVG11, and the subordinate digit line SD20, wherein gates of the memory cell transistors are respectively connected to the word lines W00, - - - W0n.

A bank BANK12 has memory cell transistors which are connected in series between the subordinate virtual ground line SVG11, and the subordinate digit line SD21, wherein gates of the memory cell transistors are respectively connected to the word lines W00, - - - W0n.

A bank BANK13 has memory cell transistors which are connected in series between the subordinate virtual ground line SVG12, and the subordinate digit line SD21, wherein gates of the memory cell transistors are respectively connected to the word lines W00, - - - W0n.

A bank BANK14 has memory cell transistors which are connected in series between the subordinate virtual ground line SVG12, and the subordinate digit line SD30, wherein gates of the memory cell transistors are respectively connected to the word lines W00, - - - W0n.

A bank BANK15 has memory cell transistors which are connected in series between the subordinate virtual ground line SVG13, and the subordinate digit line SD30, wherein gates of the memory cell transistors are respectively connected to the word lines W00, - - - W0n.

A bank BANK16 has memory cell transistors which are connected in series between the subordinate virtual ground line SVG13, and the subordinate digit line SD31, wherein gates of the memory cell transistors are respectively connected to the word lines W00, - - - W0n.

A bank BANK17 has memory cell transistors which are connected in series between the subordinate virtual ground line SVG20, and the subordinate digit line SD31, wherein gates of the memory cell transistors are respectively connected to the word lines W00, - - - W0n.

The above eight banks BANK10, BANK11, BANK12, BANK13, BANK14, BANK15, BANK16, and BANK17 form a second unit. The number of the banks for a single unit may optionally be decided in consideration of memory capacity.

A bank BANK20 has memory cell transistors which are connected in series between the subordinate virtual ground line SVG20, and the subordinate digit line SD40, wherein gates of the memory cell transistors are respectively connected to the word lines W00, - - - W0n.

A bank BANK21 has memory cell transistors which are connected in series between the subordinate virtual ground line SVG21, and the subordinate digit line SD40, wherein gates of the memory cell transistors are respectively connected to the word lines W00, - - - W0n.

A bank BANK22 has memory cell transistors which are connected in series between the subordinate virtual ground line SVG21, and the subordinate digit line SD41, wherein gates of the memory cell transistors are respectively connected to the word lines W00, - - - W0n.

A bank BANK23 has memory cell transistors which are connected in series between the subordinate virtual ground line SVG22, and the subordinate digit line SD41, wherein gates of the memory cell transistors are respectively connected to the word lines W00, - - - W0n.

A bank BANK24 has memory cell transistors which are connected in series between the subordinate virtual ground line SVG22, and the subordinate digit line SD50, wherein gates of the memory cell transistors are respectively connected to the word lines W00, - - - W0n.

A bank BANK25 has memory cell transistors which are connected in series between the subordinate virtual ground line SVG23, and the subordinate digit line SD50, wherein gates of the memory cell transistors are respectively connected to the word lines W00, - - - W0n.

Figure 5:
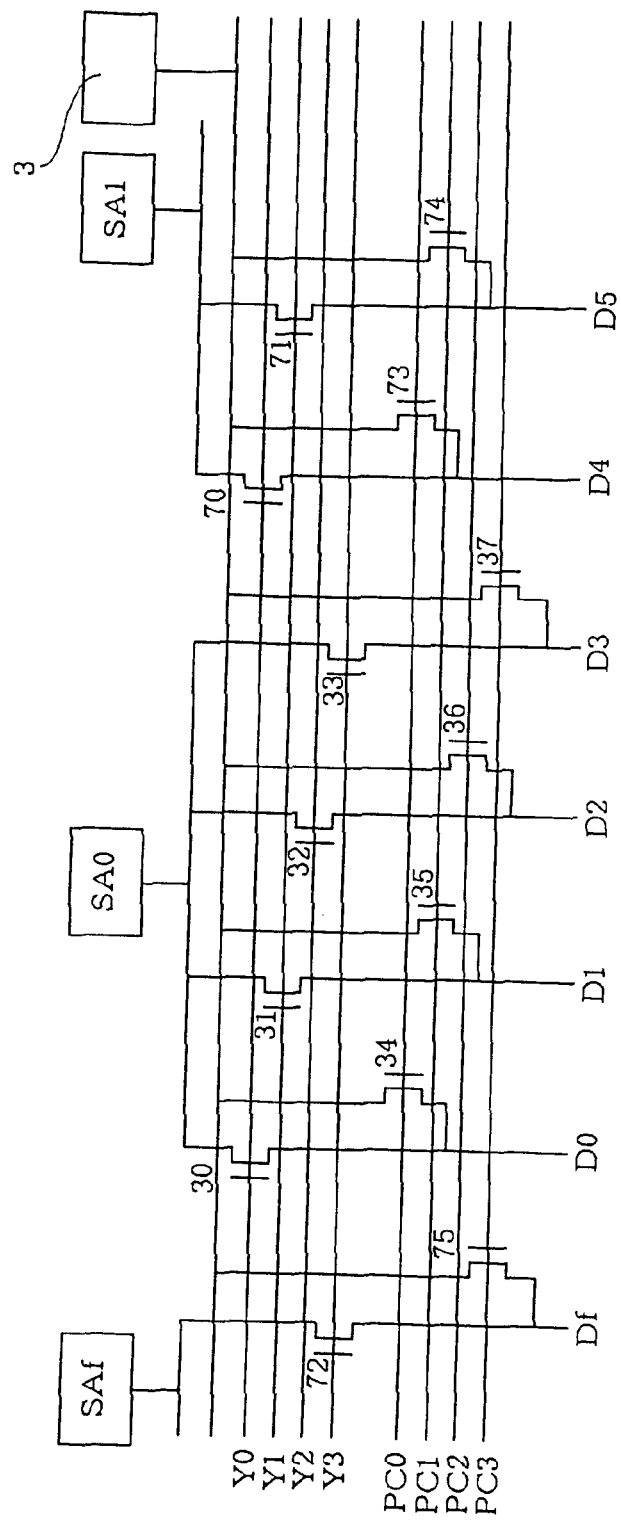
FIG. 5 is a fragmentary circuit diagram of the Y-selector circuit in the semiconductor memory device of FIG. 3.

FIG. 5 is a fragmentary circuit diagram of the Y-selector circuit in the semiconductor memory device of FIG. 3. The Y-selector circuit 2 include selecting signal lines Y0, Y1, Y2, Y3, PC0, PC1, PC2, and PC3, and transistors 30, 31, 32, 33, 34, 35, 36, 37, 70, 71, 72, 73, 74, and 75. Drains of the transistors 30, 31, 32, and 33 are connected to the sense amplifier SA0. Drains of the transistors 70, 71, and non-illustrated other transistors are connected to the sense amplifier SA1. A drain of the transistor 72 is connected to the sense amplifier SAf.

The selecting line Y0 is connected to gates of the transistors 30 and 70. The selecting line Y1 is connected to gates of the transistors 31 and 71. The selecting line Y2 is connected to gates of the transistors 32 and 72. The selecting line Y3 is connected to gates of the transistors 33 and 73. A source of the transistor 30 is connected to the main digit line D0. A source of the transistor 31 is connected to the main digit line D1. A source of the transistor 32 is connected to the main digit line D2. A source of the transistor 33 is connected to the main digit line D3. A source of the transistor 70 is connected to the main digit line D4. A source of the transistor 71 is connected to the main digit line D5. A source of the transistor 72 is connected to the main digit line Df.

Drains of the transistors 34, 35, 36, 37, 73, 74 and 75 are connected to the pre-charge circuit 3. The selecting line PC0 is connected to gates of the transistors 34 and 73. The selecting line PC1 is connected to gates of the transistors 35 and 74. The selecting line PC2 is connected to gate of the transistor 36. The selecting line PC3 is connected to gates of the transistors 37 and 75. A source of the transistor 34 is connected to the main digit line D0. A source of the transistor 35 is connected to the main digit line D1. A source of the transistor 36 is connected to the main digit line D2. A source of the transistor 37 is connected to the main digit line D3. A source of the transistor 73 is connected to the main digit line D4. A source of the transistor 74 is connected to the main digit line D5.

The sense amplifiers are provided for every sixteen banks and the pre-charge circuit 3 is provided for all banks.

Figure 6:
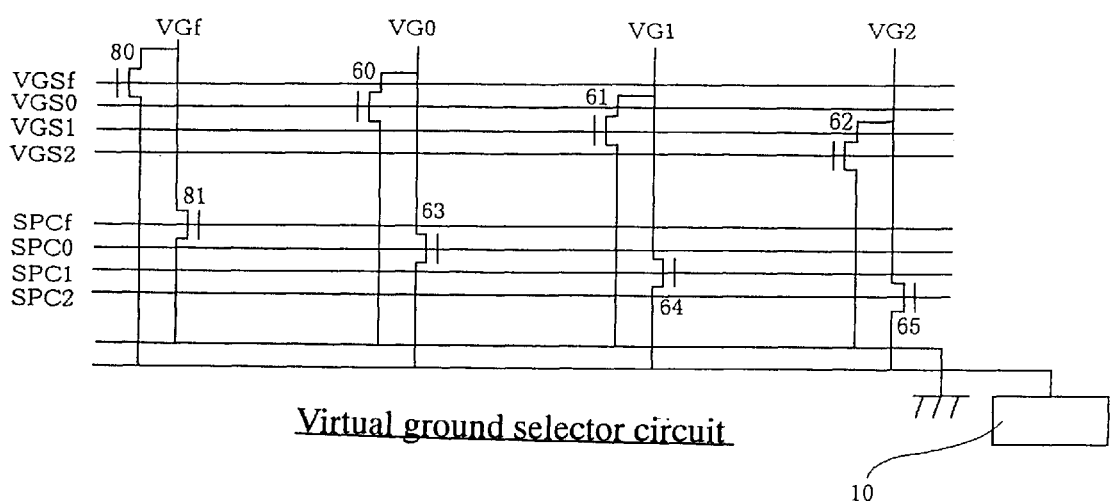
FIG. 6 is a fragmentary circuit diagram of the virtual ground selector circuit in the semiconductor memory device of FIG. 3.

FIG. 6 is a fragmentary circuit diagram of the virtual ground selector circuit in the semiconductor memory device of FIG. 3. The virtual ground selector circuit 8 include selecting signal lines VGSf, VGS0, VGS1, VGS2, SPCf, SPC0, SPC1, and SPC2, and transistors 60, 61, 62, 63, 64, 65, 80, and 81. The selecting signal line VGSf is connected to a gate of the transistor 80. The selecting signal line VGS0 is connected to a gate of the transistor 60. The selecting signal line VGS1 is connected to a gate of the transistor 61. The selecting signal line VGS2 is connected to a gate of the transistor 62. The selecting signal line SPCf is connected to a gate of the transistor 81. The selecting signal line SPC0 is connected to a gate of the transistor 63. The selecting signal line SPC1 is connected to a gate of the transistor 64. The selecting signal line SPC3 is connected to a gate of the transistor 65.

Drains of the transistors 80 and 81 are connected to the main virtual ground line VGf. Drains of the transistors 60 and 63 are connected to the main virtual ground line VG0. Drains of the transistors 61 and 64 are connected to the main virtual ground line VG1. Drains of the transistors 62 and 65 are connected to the main virtual ground line VG2. Sources of the transistors 60, 61, 62 and 81 are connected to the ground line GND. Sources of the transistors 63, 64, 65 and 80 are connected to the subordinate pre-charge circuit 10.

FIG. 7 is a table of truth values for selecting banks of the memory cell region in the semiconductor memory device of FIG. 3, wherein mark "H" means high level, and no mark means low level. The table describes the banks BANK00, - - - BANK07, and BANK 10, - - - BANK 17. The truth values of those banks are common to further banks BANK20, - - - BANK27, and BANK 30, - - - BANK 37, and to further more banks BANK2n0, - - - BANK2n7, and BANK (2n+1)0, - - - BANK (2n+1)7.

Operations of the memory cells will be described if a memory cell transistor "A" (BANK02, word W00) is selected in the memory cell region 7. The bank selecting line BS1 and the ground selecting line GS1 are high level. The Y-selector circuit 2 places the selecting signal lines Y0 and PC1 in high level. The virtual ground selector circuit places the selecting signal lines VGS0 and SPC1 in high level.

The bank selecting line BS1 in high level turns the bank selector transistors Tb1, Tb3, Tb5 and Tb7 ON. The ground selecting line in high level also turns the ground selector transistors Tg1 and Tg5 ON. The selecting signal line VGS0 in high level turns the transistor 60 ON, whereby the main virtual ground line VG0 is connected to the ground line GND by the virtual ground selector circuit 8. The selecting signal line SPC1 in high level turns the transistor 64 ON, whereby the main virtual ground line VG1 is connected to the subordinate pre-charge circuit 10 by the virtual ground selector circuit 8.

As a result, the main digit line D0 has a first current path to the ground line GND, wherein the first current path includes the bank selector transistor Tb1, the memory cell transistor "A", the ground selector transistor Tg1, the main virtual ground line VG0, the transistor 60 of the virtual ground selector circuit 8, and the ground line GND. The main digit line D1 has a second current path to the subordinate pre-charge circuit 10, wherein the second current path includes the bank selector transistor Tb5, the memory cell transistor "A'", the ground selector transistor Tg5, the main virtual ground line VG1, the transistor 64 of the virtual ground selector circuit 8, and the subordinate pre-charge circuit 10. At this time, in the Y-selector circuit 2, the selecting line Y0 is in high level, and the selecting line Y0 turns the transistor 30 ON, whereby the main digit line D0 is connected to the sense amplifier SA0. The selecting line PC1 is not selected, whereby the memory cell "A'" is not applied with the voltage from the sense amplifier SA0. The memory cell "A" is ON-bit cell, and a current including information flows onto the main digit line D2, whereby the information is read out.

The main digit line D1 is connected to the pre-charge circuit 3, whereby a pre-charge voltage is supplied from the pre-charge circuit 3 through the bank selector transistor Tb3 to the cell transistors 03, 04, 05 and 06. This pre-charge voltage has the same voltage as the bias voltage supplied from the sense amplifier SA0. If the memory cell "A" is OFF-bit cell, the sources and drains of the memory cell transistors in the banks BANK03, BANK04, BANK05, and BANK06 have the same potential, whereby a read-out current is not applied to the memory cell transistors in the banks BANK03, BANK04, BANK05, and BANK06, and it is correctly recognized that the memory cell "A" is OFF-bit cell.

The main virtual GND line VG1 is connected to the subordinate pre-charge circuit 10. Similarly to operations of the pre-charges circuit 3, the charge voltage is applied from the subordinate pre-charge circuit 10 through the ground selector transistor Tg5 to the memory cell transistors in the banks BANK11, and BANK12. In this example, memory cells in both sides are OFF-bit cells, for which reason the voltage from the pre-charge circuit 3 is not supplied to other devices. Assuming that all of the memory cells are ON-bit cells, the capacity of the pre-charge circuit 3 might be insufficient, and the subordinate pre-charge circuit 10 is provided for supplementing the current.

Figure 8:
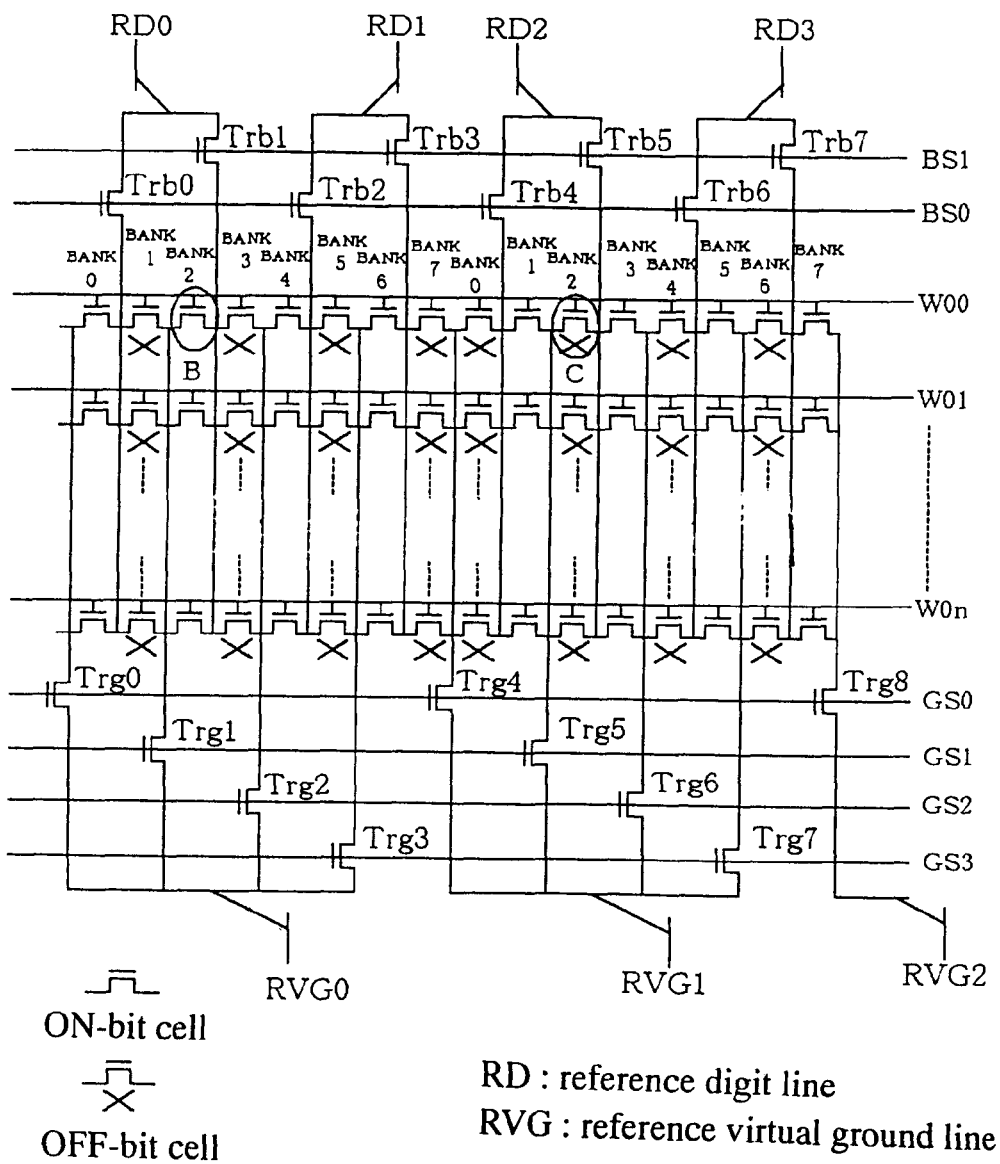
FIG. 8 is a circuit diagram of the reference cell region of the semiconductor memory device of FIG. 3.

FIG. 8 is a circuit diagram of the reference cell region of the semiconductor memory device of FIG. 3. The reference cell region 6 has substantially the same interconnection routines as the memory cell region 7 which has been described above with reference to FIG. 4. The reference cell region 6 shows substantially the same operations as the memory cell region 7 which has been described above.

Reference digit lines RD0, RD1, RD2, and RD3 of the reference cell region 6 correspond to the above main digit lines D0, D1, D2, and D3 of the memory cell region 7. Bank selector transistors Trb0, Trb1, Trb2, Trb3, Trb4, Trb5, Trb6 and Trb7 of the reference cell region 6 correspond to the above bank selector transistors Tb0, Tb1, Tb2, Tb3, Tb4, Tb5, Tb6 and Tb7 of the memory cell region 7. Ground selector transistors Trg0, Trg1, Trg2, Trg3, Trg4, Trg5, Trg6, and Trg7 of the reference cell region 6 correspond to the above ground selector transistors Tg0, Tg1, Tg2, Tg3, Tg4, Tg5, Tg6, and Tg7 of the memory cell region 7. Reference virtual ground lines RVG0, RVG1, and RVG2 of the reference cell region 6 correspond to the above main virtual ground lines VG0, VG1, and VG2 of the memory cell region 7.

In the reference cell region 6, cell transistors in adjacent two banks to a cell transistor to be referred are off-bit cells. The reference cell region 6 has sixteen banks classified into first and second eight-bank units. The first eight-bank unit comprises four even number banks BANK0, BANK2, BANK4 and BANK6 which are ON-bit cells, and four odd number banks BANK1, BANK3, BANK5 and BANK7 which are OFF-bit cells. The second eight-bank unit comprises four even number banks BANK0, BANK2, BANK4 and BANK6 which are OFF-bit cells, and four odd number banks BANK1, BANK3, BANK5 and BANK7 which are ON-bit cells. The word lines, the bank selecting lines and the ground selecting lines in the reference cell region 6 are common to the memory cell region 7.

Figure 9:
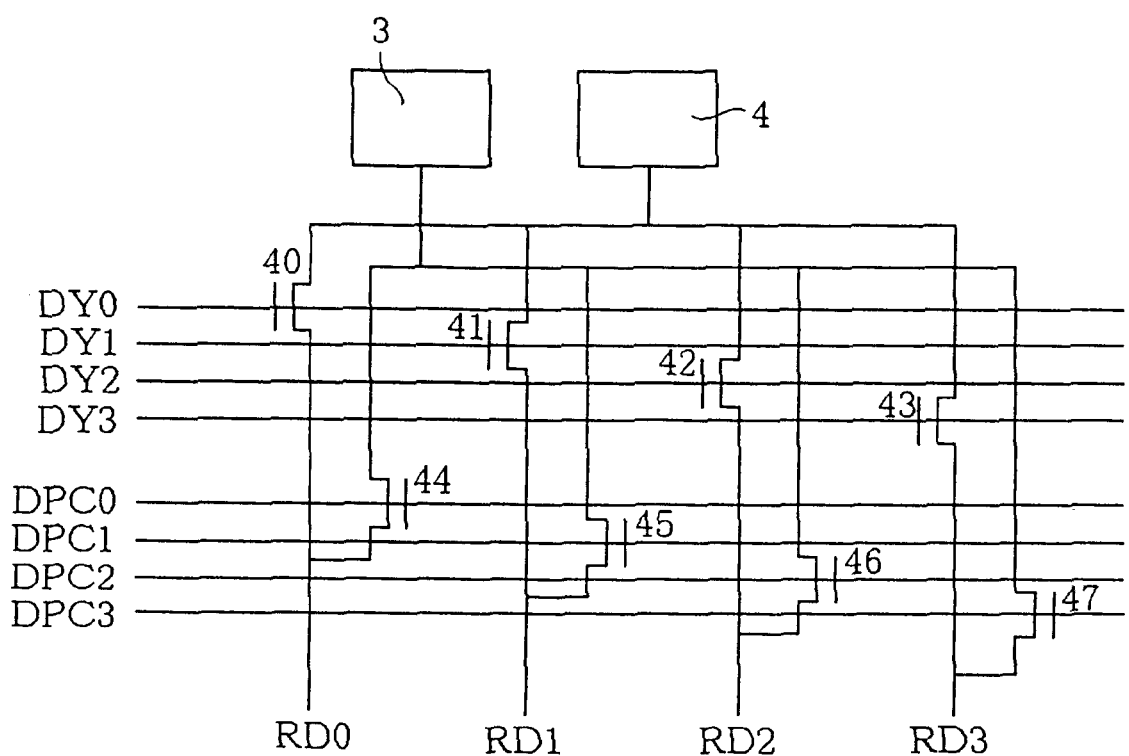
FIG. 9 is a circuit diagram of the dummy Y-selector circuit of the semiconductor memory device of FIG. 3.

FIG. 9 is a circuit diagram of the dummy Y-selector circuit of the semiconductor memory device of FIG. 3. The dummy Y-selector circuit 5 has substantially the same interconnection routine as the Y-selector circuit 2 which has been described above with reference to FIG. 5. The dummy Y-selector circuit 5 exhibits substantially the same operations as the Y-selector circuit 2 which has been described above. Selecting signal lines DY0, DY1, DY2, and DY3 of the dummy Y-selector circuit 5 correspond to the above selecting signal lines Y0, Y1, Y2, and Y3 of the Y-selector circuit 2. Selecting signal lines DPC0, DPC1, DPC2 and DPC3 of the dummy Y-selector circuit 5 correspond to the above selecting signal lines PC0, PC1, PC2 and PC3 of the Y-selector circuit 2. Transistors 40, 41, 42, 43, 44, 45, 46, and 47 of the dummy Y-selector circuit 5 correspond to the above transistors 30, 31, 32, 33, 34, 35, 36, and 37 of the Y-selector circuit 2. Reference digit lines RD0, RD1, RD2 and RD3 of the dummy Y-selector circuit 5 correspond to the above main digit lines D0, D1, D2 and D3 of the Y-selector circuit 2.

Figure 10:
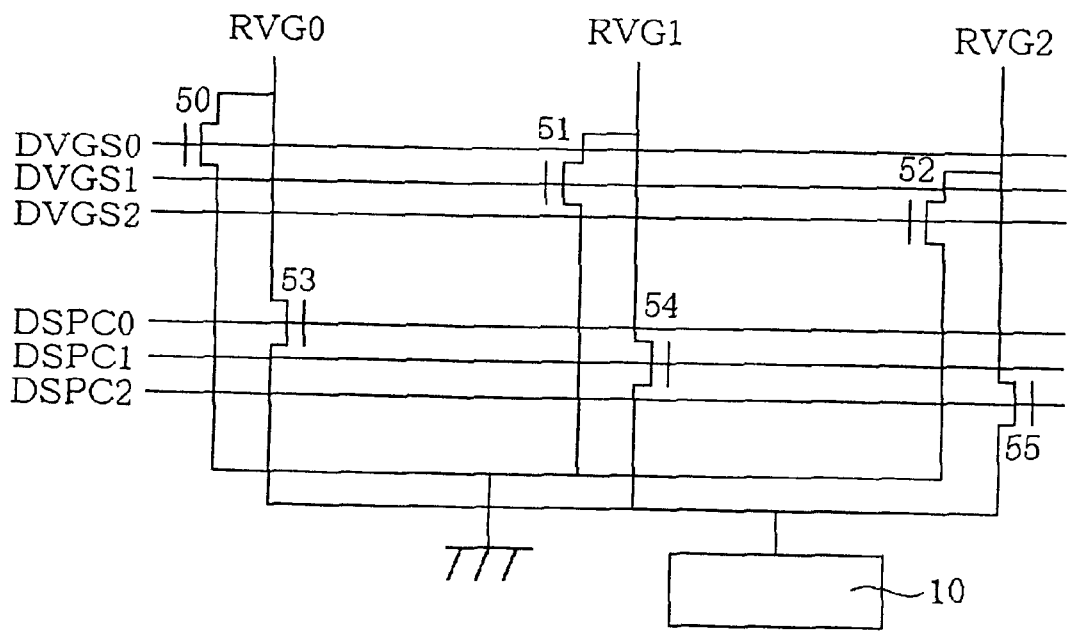
FIG. 10 is a circuit diagram of the dummy virtual ground selector circuit of the semiconductor memory device of FIG. 3.

FIG. 10 is a circuit diagram of the dummy virtual ground selector circuit of the semiconductor memory device of FIG. 3. The dummy virtual ground selector circuit 9 has substantially the same interconnection routine as the virtual ground selector circuit 8 which has been described above with reference to FIG. 6. The dummy virtual ground selector circuit 9 also exhibits substantially the same operations as the virtual ground selector circuit 8 which has been described above. Selecting signal lines DVGS0, DVGS1, and DVGS2 of the dummy virtual ground selector circuit 9 correspond to the above selecting signal lines VGS0, VGS1, and VGS2 of the virtual ground selector circuit 8. Selecting signal lines DSPC0, DSPC1, and DSPC2 of the dummy virtual ground selector circuit 9 correspond to the above selecting signal lines SPC0, SPC1, and SPC2 of the virtual ground selector circuit 8. Transistors 50, 51, 52, 53, 54 and 55 of the of the dummy virtual ground selector circuit 9 correspond to the above transistors 60, 61, 62, 63, 64, and 65 of the virtual ground selector circuit 8. Reference virtual ground lines RVG0, RVG1, and RVG2 of the of the dummy virtual ground selector circuit 9 correspond to the above main virtual ground lines VG0, VG1, and VG2 of the virtual ground selector circuit 8.

The selecting signals to the dummy Y-selector 5 and the dummy virtual ground selector 9 are independent from the selecting signals of the memory cell region 7. The above selecting signals to the dummy Y-selector 5 and the dummy virtual ground selector 9 are decided depending on which bank of the memory cell region is selected.

FIG. 11 is a table of truth values for selecting banks of the reference cell region in the semiconductor memory device of FIG. 3, wherein mark "H" means high level, and no mark means low level. The table describes the banks BANK00, - - - BANK07. Operations of the reference cell region 6 are substantially the same as the memory cell region 7. Operations of the memory cells in the memory cell region 7 upon selecting the BANK00 and the BANK10 on table 7 are identical with operations of the reference cells in the memory cell region 6 upon selecting the BANK00 on table 11. Operations of the memory cells in the memory cell region 7 upon selecting the BANK01 and the BANK11 on table 7 are identical with operations of the reference cells in the memory cell region 6 upon selecting the BANK01 on table 11. Operations of the memory cells in the memory cell region 7 upon selecting the BANK02 and the BANK12 on table 7 are identical with operations of the reference cells in the memory cell region 6 upon selecting the BANK02 on table 11. Operations of the memory cells in the memory cell region 7 upon selecting the BANK03 and the BANK13 on table 7 are identical with operations of the reference cells in the memory cell region 6 upon selecting the BANK03 on table 11. Operations of the memory cells in the memory cell region 7 upon selecting the BANK04 and the BANK14 on table 7 are identical with operations of the reference cells in the memory cell region 6 upon selecting the BANK04 on table 11. Operations of the memory cells in the memory cell region 7 upon selecting the BANK05 and the BANK15 on table 7 are identical with operations of the reference cells in the memory cell region 6 upon selecting the BANK05 on table 11. Operations of the memory cells in the memory cell region 7 upon selecting the BANK06 and the BANK16 on table 7 are identical with operations of the reference cells in the memory cell region 6 upon selecting the BANK06 on table 11. Operations of the memory cells in the memory cell region 7 upon selecting the BANK07 and the BANK17 on table 7 are identical with operations of the reference cells in the memory cell region 6 upon selecting the BANK07 on table 11.

As described above, operations of the reference cell region 6 are substantially the same as the memory cell region 7. A current route is made from the reference amplifier 4 through the transistor 40 of the dummy Y-selector circuit, the reference digit line RD0, the bank selector transistor Trb1, the reference cell B, the ground selector transistor Trg1, the reference virtual ground line RVG0, the transistor 50 of the dummy virtual ground selector circuit 9 to the ground line GND, whereby stored information in the reference cell B is read out.

Figure 12:
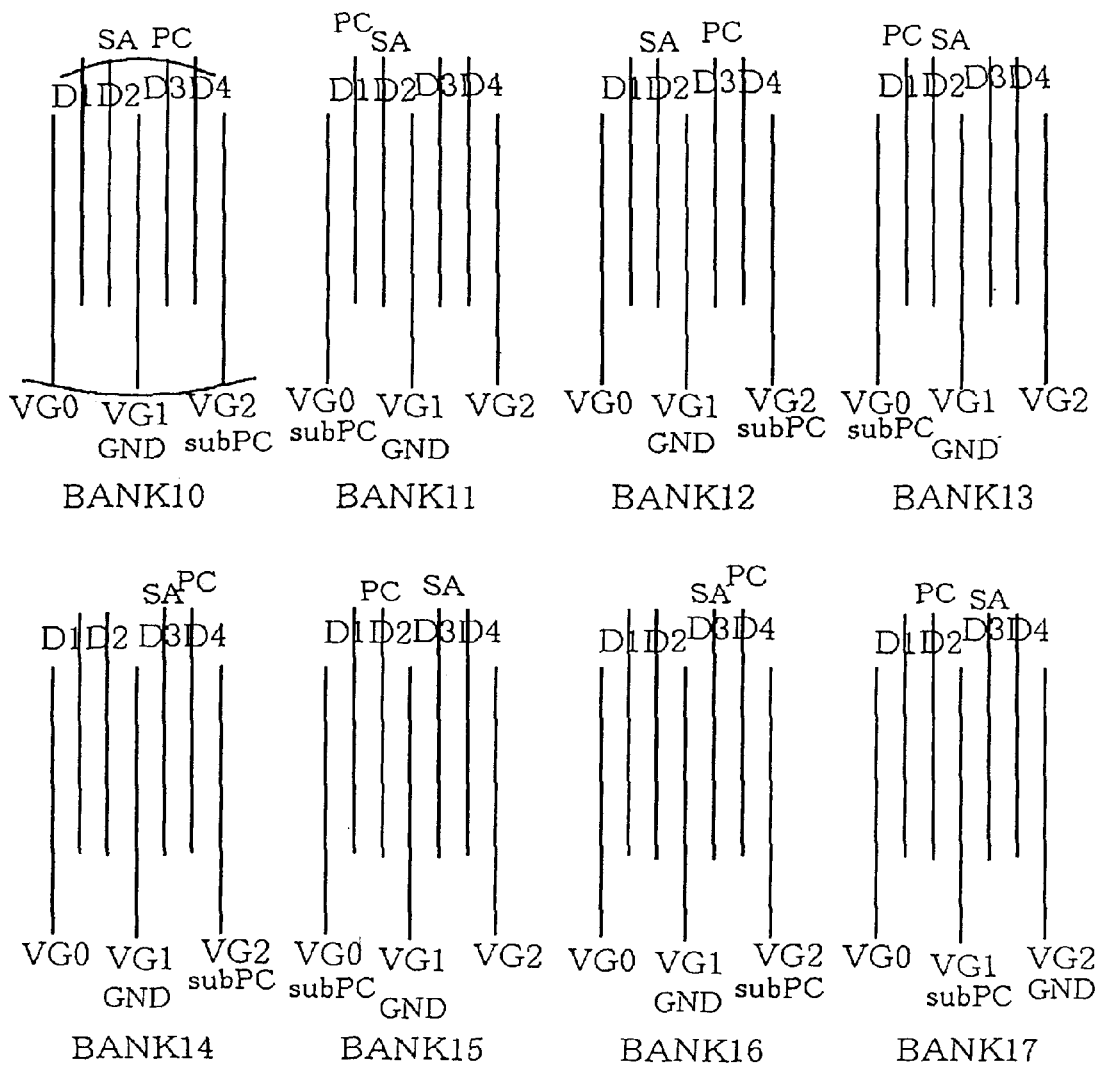
FIG. 12 is a view of respective positional inter-relationships between main digit lines and main virtual ground lines for various banks.

FIG. 12 is a view of respective positional inter-relationships between main digit lines and main virtual ground lines for various banks. The main digit lines are displaced upwardly. The main virtual ground lines are displaced downwardly. Eight types of the positional inter-relationships are illustrated for the eight banks BANK10, BANK11, BANK12, BANK13, BANK14, BANK15, BANK16, and BANK17. In the banks BANK11, BANK13, BANK14 and BANK16, the main digit lines respectively connected to the pre-charge circuit "PC" and the sense amplifier "SA" are adjacent to each other.

Figure 13:
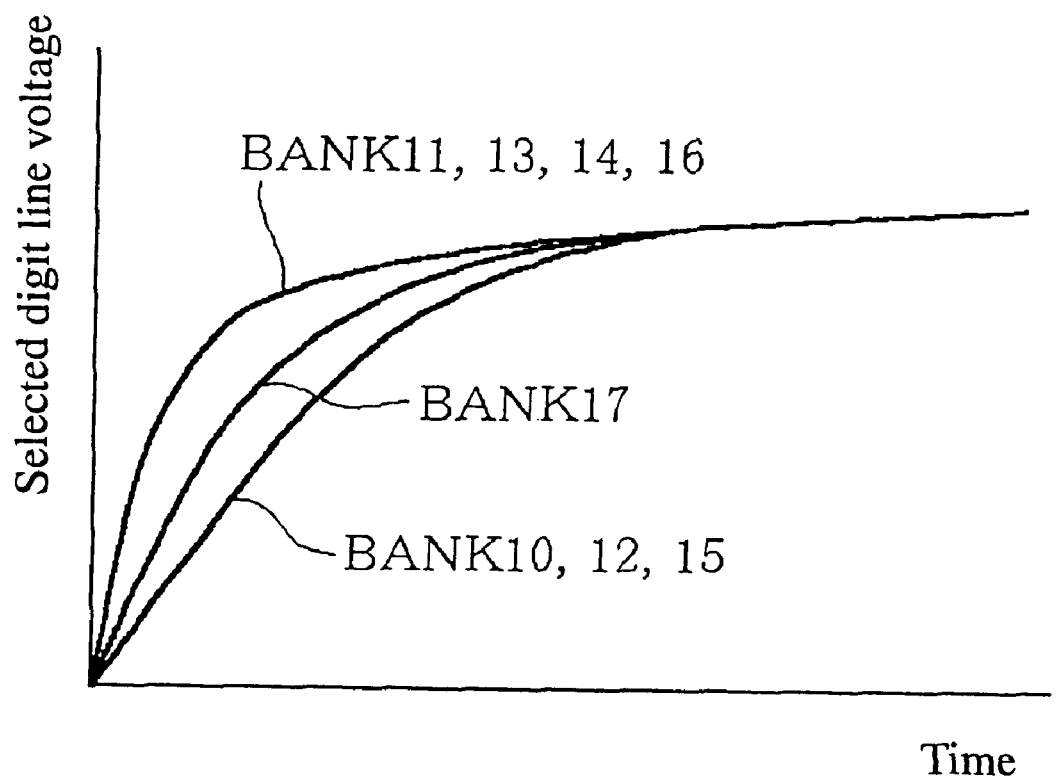
FIG. 13 is a diagram of time-variations in voltage of the selected digit lines upon selecting the respective eight banks.

FIG. 13 is a diagram of time-variations in voltage of the selected digit lines upon selecting the respective eight banks, wherein the cell for read out object is ON-bit cell. In the banks BANK11, BANK13, BANK14 and BANK16, the voltage rising speed is highest because the digit line connected to the pre-charge circuit is closer to the digit line connected to the sense amplifier, and thus a charge current from the sense amplifier for charging up the pre-charge circuit is small.

If a bank of the memory cell region is selected, then the bank of the reference cell region having the same structure is always selected. Even the charge-up speed of the main digit line is different between different banks due to parasitic capacitances between interconnections. The charge-up speed of the main digit line in the memory cell region 7 is identical with the charge-up speed of the reference digit line in the reference cell region 6. The semiconductor memory device is free of any bank column dependency in read-out operation.

Figure 14A:
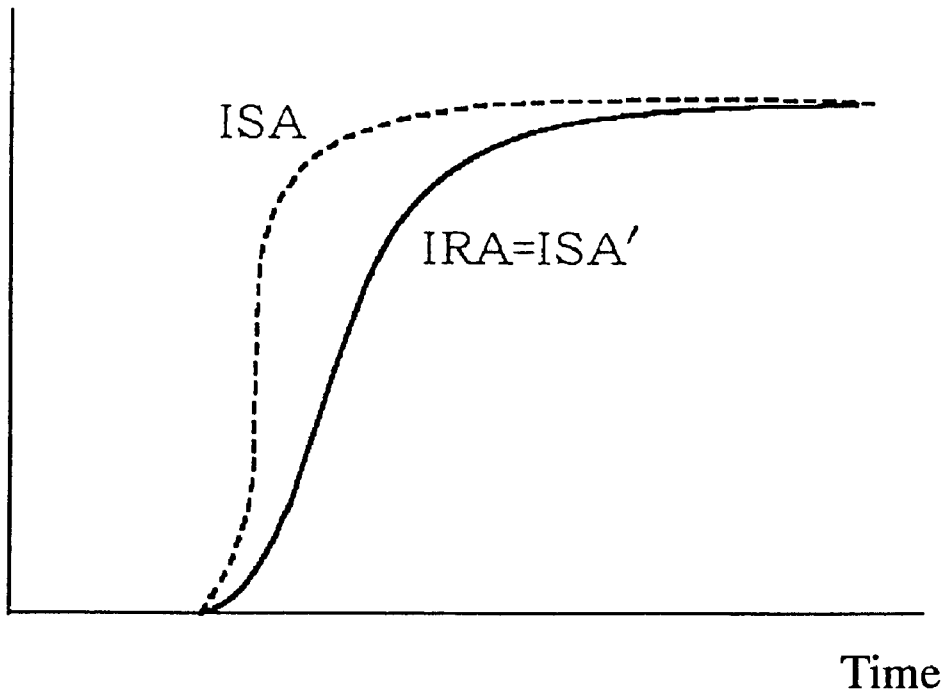
FIG. 14A is a diagram of time-dependent variations in sense amplifier currents ISA from the sense amplifiers and in reference sense amplifier currents IRA from the reference sense amplifiers when a main memory cell "A" is selected, wherein adjacent cells are ON-bit cells.
Figure 14B:
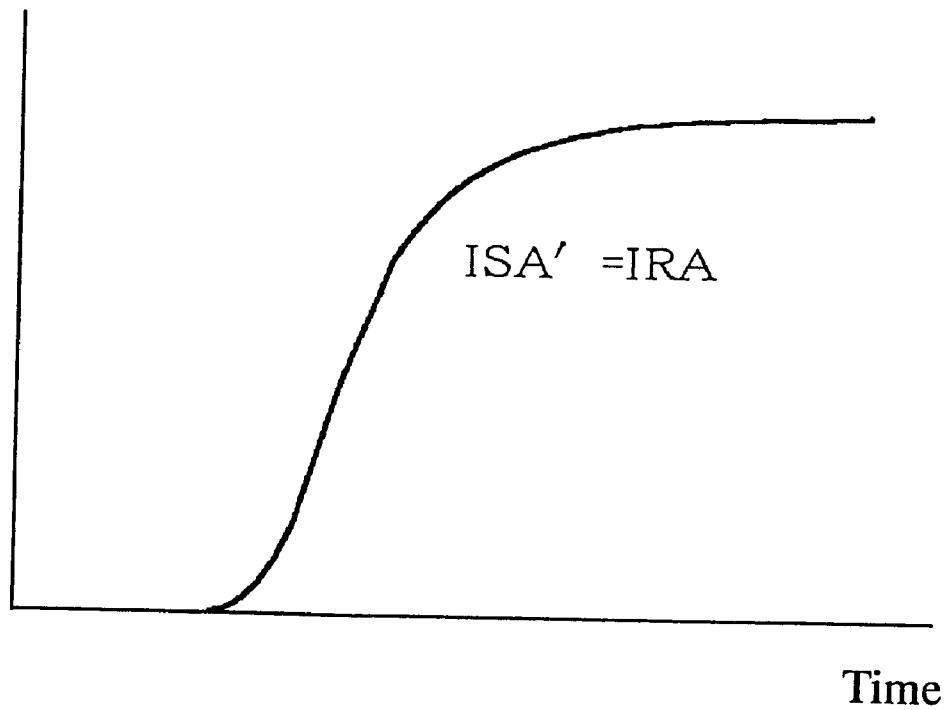
FIG. 14B is a diagram of time-dependent variations in sense amplifier currents ISA from the sense amplifiers and in reference sense amplifier currents IRA from the reference sense amplifiers when another main memory cell "A'" is selected, wherein adjacent cells are OFF-bit cells.

FIG. 14A is a diagram of time-dependent variations in sense amplifier currents ISA from the sense amplifiers and in reference sense amplifier currents IRA from the reference sense amplifiers when a main memory cell "A" is selected, wherein adjacent cells are ON-bit cells. FIG. 14B is a diagram of time-dependent variations in sense amplifier currents ISA from the sense amplifiers and in reference sense amplifier currents IRA from the reference sense amplifiers when another main memory cell "A'" is selected, wherein adjacent cells are OFF-bit cells. In either case of selecting the memory cells "A" and "A'", then the reference cell "B" on the even number bank is selected. The sense amplifier current ISA upon selecting the memory cell "A", adjacent to ON-bit cells, are compared with the sense amplifier current ISA' upon selecting the memory cell "A'", adjacent to OFF-bit cells. The subordinate virtual ground lines SVG02 are charged-up through the adjacent cells. The sense amplifier current ISA upon selecting the memory cell "A" become temporary higher than the sense amplifier current ISA' upon selecting the memory cell "A'". Since, however, the sense amplifier current ISA is larger than the reference sense amplifier circuit IRA, the differential circuit may rapidly judge the ON-bit cell immediately after application of the sense amplifier current to the cells is started.

In the reference cell region, adjacent cells to the selected reference cell are always OFF-bit cells, whereby no capacitance is provided to the reference current route. Accordingly, in case of selecting the memory cell "A'" adjacent to two OFF-bit cells, the reference sense amplifier current is equal to the sense amplifier current ISA' to the sense amplifier current. The differential circuit may rapidly judge the ON-bit cell immediately after application of the sense amplifier current ISA' to the cells is started.

The reference cell region 6 has the same configuration as the memory cell region 7, so that the properties of the reference digit lines are decided to follow to the change of addresses of the memory cell region 7, thereby avoiding the bank-dependency.

Cells transistors in the adjacent banks to the designated bank are OFF-bit cells to eliminate any substantive influence of the capacitance added to the current path for avoiding the code-pattern dependency.

Although the invention has been described above in connection with several preferred embodiments therefor, it will be appreciated that those embodiments have been provided solely for illustrating the invention, and not in a limiting sense. Numerous modifications and substitutions of equivalent materials and techniques will be readily apparent to those skilled in the art after reading the present application, and all such modifications and substitutions are expressly understood to fall within the true scope and spirit of the appended claims.

What is claimed is:

1. A semiconductor memory device including:
   a memory cell region having main virtual ground lines; and
   a reference cell region having reference virtual ground lines, and said reference cell region having substantially the same interconnection routine as said memory cell region,
   wherein said reference cell region includes adjacent first and second subordinate regions, and said first subordinate region having even number banks having ON-bit cells and odd number banks having OFF-bit cells, and said second subordinate region having even number banks having OFF-bit cells and odd number banks having ON-bit cells.

2. The semiconductor memory device as claimed in claim 1, wherein, in said reference cell region, adjacent reference cells to a selected reference cell to be referred are off-bit cells.

3. The semiconductor memory device as claimed in claim 1, further comprising a current detecting circuit, and
   wherein said memory cell region further includes main digit lines,
   at least first one of said main digit lines is selectively connected to said current detecting circuit,
   at least first one of said main virtual ground lines is selectively connected to a ground line, and
   said at least first one main digit line connected to said current detecting circuit and said at least first one main virtual ground line connected to said ground line form a first main current route,
   wherein said reference cell region further includes reference digit lines, at least first one of said reference digit lines is selectively connected to said current detecting circuit, at least first one of said reference virtual ground lines is selectively connected to said ground line, and said at least first one reference digit line connected to said current detecting circuit and said at least first one reference virtual ground line connected to said ground line form a first reference current route, which is identical with said first main current route.

4. The semiconductor memory device as claimed in claim 3, further comprising:

a main digit line selector circuit for selecting at least one of said main digit lines, so that said selected at least one main digit line is connected to said current detecting circuit; and a reference digit line selector circuit for selecting at least one of said reference digit lines, so that said selected at least one reference digit line is also connected to said current detecting circuit.

5. The semiconductor memory device as claimed in claim 3, further comprising:

a main virtual ground line selector circuit for selecting at least one of said main virtual ground lines, so that said selected at least one main virtual ground line is connected to a ground line; and a reference virtual ground selector circuit for selecting at least one of said reference virtual ground lines, so that said selected at least one reference virtual ground line is also connected to said ground line.

6. The semiconductor memory device as claimed in claim 3, wherein said memory cell region further includes subordinate memory digit lines, and said reference cell region further includes subordinate reference digit lines, and further comprising a bank selecting circuit for selecting at least one of said subordinate memory digit lines, so that said selected at least one subordinate memory digit line is connected to said main digit line, and further selecting at least one of said subordinate reference digit lines, so that said selected at least one subordinate reference digit line is connected to said reference digit line.

7. The semiconductor memory device as claimed in claim 3, further comprising a main pre-charge circuit, and wherein at least second one of said main digit lines is selected and connected to said main pre-charge circuit, wherein said at least first one main digit line connected to said current detecting circuit, said at least second one of said main digit line connected to said main pre-charge circuit, and said at least first one main virtual ground line connected to said ground line form a second main current route, wherein at least second one of said reference digit lines is selected and connected to said main pre-charge circuit, wherein said at least first one reference digit line connected to said current detecting circuit, said at least second one reference digit line connected to said main pre-charge circuit, and said at least first one reference virtual ground line connected to said ground line form a first reference current route, which is identical with said first main current route.

8. The semiconductor memory device as claimed in claim 7, further comprising a subordinate pre-charge circuit, and wherein at least second one of said main virtual ground lines is selected and connected to said subordinate pre-charge circuit, wherein said at least first one main digit line connected to said current detecting circuit, said at least second one of said main digit line connected to said subordinate pre-charge circuit, said at least first one main virtual ground line connected to said ground line, and said second one main virtual ground line form a third main current route, wherein at least second one of said reference virtual ground lines is selected and connected to said subordinate pre-charge circuit, and wherein said at least first one reference digit line connected to said current detecting circuit, said at least second one reference digit line connected to said subordinate pre-charge circuit, said at least first one reference virtual ground line connected to said ground line, and said at least second one reference virtual ground line form a fourth reference current route, which is identical with said third main current route.

9. The semiconductor memory device as claimed in claim 3, further comprising:

subordinate memory digit lines in said memory cell region;

subordinate reference digit lines in said reference cell region; and at least a bank selecting circuit for selecting at least one of said subordinate memory digit lines and connecting said selected at least one subordinate memory digit line to said main digit line, as well as for selecting at least one of said subordinate reference digit lines and connecting said selected at least one subordinate reference digit line to said reference digit line.

10. A semiconductor memory device comprising:

a memory cell region including a plurality of main banks, each having memory cells, main digit lines, main virtual ground lines, subordinate digit lines, and subordinate virtual ground lines;

a main digit line selector circuit being connected to said main digit lines for selecting at least one of said main digit lines;

a main virtual ground selector circuit being connected to said main virtual ground lines for selecting at least one of said main virtual ground lines;

a reference cell region including a plurality of reference banks, each having reference memory cells, reference digit lines, reference virtual ground lines, subordinate reference digit lines and subordinate reference virtual ground lines;

a reference digit line selector circuit being connected to said reference digit lines for selecting at least one of said reference digit lines;

a reference virtual ground selector circuit being connected to said reference virtual ground lines for selecting at least one of said reference virtual ground lines;

a bank selecting circuit connected to said subordinate digit lines and said reference subordinate digit lines for selecting at least one of said subordinate digit lines and connecting said at least one subordinate digit line to said main digit line, and further selecting at least one of said subordinate reference digit lines and connecting said at least one subordinate reference digit line to said reference digit line; and a ground selecting circuit connected to said subordinate main virtual ground lines and said subordinate reference virtual ground lines for selecting at least one of said subordinate main virtual ground lines and connecting said at least one subordinate main virtual ground line to said main virtual ground line, and further selecting at least one of said subordinate reference virtual ground lines and connecting said at least one subordinate reference virtual ground line to said reference virtual ground line, wherein said reference cell region includes adjacent first and second subordinate regions, and said first subordinate region having even number banks having ON-bit cells and odd number banks having OFF-bit cells, and said second subordinate region having even number banks having OFF-bit cells and odd number banks having ON-bit cells.

11. The semiconductor memory device as claimed in claim 10, wherein said reference cell region has substantially the same interconnection routine as said memory cell region.

12. The semiconductor memory device as claimed in claim 10, wherein in said reference cell region, adjacent reference cells to a selected reference cell to be referred are off-bit cells.

13. The semiconductor memory device as claimed in claim 10, wherein said memory cell region possesses a first current routine pattern through said main digit line to said main memory cell designated in accordance with a address signal, and said reference cell region possesses a second current routine pattern through said reference digit line to said reference memory cell in accordance with said address signal, and wherein said first current routine pattern is always identical with said second current routine pattern upon designating any memory cell addresses.

14. A semiconductor memory device, comprising:

a reference cell region having first and second subordinate regions, wherein an even number banks in the first subordinate region and an odd number banks in the second subordinate region include ON-bit cells, and wherein an odd number of banks in the first subordinate region and an even number banks in the second subordinate region include OFF-bit cells.

* * * * *